(12) United States Patent
Cipolla et al.

(10) Patent No.: US 8,004,841 B2
(45) Date of Patent: Aug. 23, 2011

(54) METHOD AND APPARATUS OF WATER COOLING SEVERAL PARALLEL CIRCUIT CARDS EACH CONTAINING SEVERAL CHIP PACKAGES

(75) Inventors: Thomas M. Cipolla, Katonah, NY (US); Shurong Tian, Mount Kisco, NY (US); Evan George Colgan, Chestnut Ridge, NY (US); Paul W. Coteus, Yorktown Heights, NY (US); Shawn Anthony Hall, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 318 days.

(21) Appl. No.: 12/115,618

(22) Filed: May 6, 2008

(65) Prior Publication Data

US 2009/0277616 A1 Nov. 12, 2009

(51) Int. Cl.
*H05K 5/00* (2006.01)
*H05K 7/20* (2006.01)
*G06F 1/20* (2006.01)
*F28F 7/00* (2006.01)
*F28D 15/00* (2006.01)

(52) U.S. Cl. ............... 361/699; 361/679.52; 361/679.53; 361/704; 361/707; 361/679.47; 361/719; 361/711; 165/104.33; 165/80.4; 174/15.1; 174/15.2

(58) Field of Classification Search ............... 361/679.47
See application file for complete search history.

(56) References Cited

U.S. PATENT DOCUMENTS

| 3,874,443 | A | * | 4/1975 | Bayer, Jr. ......................... 165/47 |
| 3,917,370 | A | * | 11/1975 | Thornton et al. ............. 439/194 |
| 4,009,423 | A | | 2/1977 | Wilson |
| 4,093,971 | A | * | 6/1978 | Chu et al. ....................... 361/702 |
| 4,315,300 | A | * | 2/1982 | Parmerlee et al. ............. 361/703 |
| 4,962,444 | A | * | 10/1990 | Niggemann ................... 361/702 |
| 5,050,037 | A | | 9/1991 | Yamamoto et al. |
| 5,057,968 | A | * | 10/1991 | Morrison ...................... 361/700 |
| 5,339,214 | A | * | 8/1994 | Nelson .......................... 361/695 |
| 5,398,748 | A | * | 3/1995 | Yamaji et al. ................ 165/80.2 |
| 5,829,516 | A | | 11/1998 | Lavochkin |

(Continued)

OTHER PUBLICATIONS

United States Office Action dated Dec. 27, 2010, received in related U.S. Appl. No. 12/185,520.

*Primary Examiner* — Jayprakash N Gandhi
*Assistant Examiner* — Bradley H Thomas
(74) *Attorney, Agent, or Firm* — Scully, Scott, Murphy & Presser, P.C.; Daniel P. Morris, Esq.

(57) ABSTRACT

A cooling or heat transfer apparatus and method is disclosed for cooling an electronic device. The apparatus includes a heat producing electronic device which may include an electronic circuit card with many heat sources. A heat transfer device is connected to the heat producing electronic device which is thermally communicating with the heat producing device for transferring heat from the heat producing device to the heat transfer device. A heat conduit is connected to the heat transfer device and thermally communicating with the heat transfer device for transferring heat to the heat conduit from the heat transfer device. A cooling housing is connected to the heat conduit and the cooling housing thermally communicating with the heat conduit for transferring heat to the cooling housing from the heat conduit. The apparatus enables the replacement of circuit cards in the field because it eliminates the need to apply thermal-interface materials.

22 Claims, 24 Drawing Sheets

U.S. PATENT DOCUMENTS

| | | | |
|---|---|---|---|
| 6,065,208 A | 5/2000 | Lamb et al. | |
| 6,111,749 A | 8/2000 | Lamb et al. | |
| 6,119,765 A | 9/2000 | Lee | |
| 6,233,150 B1 | 5/2001 | Lin et al. | |
| 6,297,966 B1 | 10/2001 | Lee et al. | |
| 6,349,035 B1* | 2/2002 | Koenen | 361/719 |
| 6,449,156 B1* | 9/2002 | Han et al. | 361/704 |
| 6,639,798 B1* | 10/2003 | Jeter et al. | 361/699 |
| 6,748,350 B2* | 6/2004 | Rumer et al. | 703/9 |
| 6,888,719 B1* | 5/2005 | Janzen et al. | 361/679.31 |
| 7,019,974 B2* | 3/2006 | Lee et al. | 361/700 |
| 7,100,506 B2 | 9/2006 | Takeda | |
| 7,106,595 B2* | 9/2006 | Foster et al. | 361/721 |
| 7,151,668 B1* | 12/2006 | Stathakis | 361/700 |
| 7,289,327 B2* | 10/2007 | Goodwin et al. | 361/701 |
| 7,400,506 B2* | 7/2008 | Hoss et al. | 361/715 |
| 7,450,384 B2* | 11/2008 | Tavassoli et al. | 361/699 |
| 7,457,122 B2 | 11/2008 | Lai et al. | |
| 7,460,367 B2* | 12/2008 | Tracewell et al. | 361/679.48 |
| 7,471,514 B2* | 12/2008 | Chen | 361/695 |
| 7,679,913 B2* | 3/2010 | Hsieh | 361/704 |
| 2002/0039282 A1 | 4/2002 | Han et al. | |
| 2003/0026076 A1 | 2/2003 | Wei | |
| 2004/0201963 A1* | 10/2004 | Garner | 361/700 |
| 2005/0103473 A1* | 5/2005 | Todd et al. | 165/104.11 |
| 2005/0141199 A1 | 6/2005 | Chiou et al. | |
| 2006/0050483 A1* | 3/2006 | Wilson et al. | 361/702 |
| 2006/0067054 A1* | 3/2006 | Wang et al. | 361/704 |
| 2006/0098409 A1* | 5/2006 | Cheon | 361/699 |
| 2006/0203454 A1 | 9/2006 | Chang | |
| 2006/0250765 A1* | 11/2006 | Yamabuchi et al. | 361/683 |
| 2006/0268519 A1* | 11/2006 | Bartley et al. | 361/699 |
| 2007/0097627 A1* | 5/2007 | Taylor et al. | 361/689 |
| 2007/0195489 A1 | 8/2007 | Lai et al. | |
| 2007/0206359 A1 | 9/2007 | Lai et al. | |
| 2007/0217153 A1* | 9/2007 | Lai et al. | 361/700 |
| 2007/0217160 A1 | 9/2007 | Legen et al. | |
| 2007/0223198 A1 | 9/2007 | Lai et al. | |
| 2007/0230127 A1* | 10/2007 | Peugh et al. | 361/699 |
| 2007/0263359 A1* | 11/2007 | Lai et al. | 361/715 |
| 2007/0263360 A1 | 11/2007 | Lai et al. | |
| 2008/0013282 A1 | 1/2008 | Hoss et al. | |
| 2008/0151487 A1 | 6/2008 | Ni et al. | |
| 2008/0251911 A1 | 10/2008 | Farnsworth et al. | |
| 2008/0259567 A1* | 10/2008 | Campbell et al. | 361/699 |
| 2008/0264613 A1* | 10/2008 | Chu | 165/104.33 |
| 2008/0273307 A1 | 11/2008 | Campbell et al. | |
| 2008/0289798 A1* | 11/2008 | Min et al. | 165/80.3 |
| 2008/0291630 A1* | 11/2008 | Monh et al. | 361/700 |
| 2009/0002951 A1 | 1/2009 | Legen et al. | |
| 2009/0034327 A1 | 2/2009 | Yun et al. | |
| 2009/0168356 A1 | 7/2009 | Chen et al. | |
| 2009/0190303 A1 | 7/2009 | Chu et al. | |
| 2009/0268408 A1 | 10/2009 | Liu et al. | |

* cited by examiner

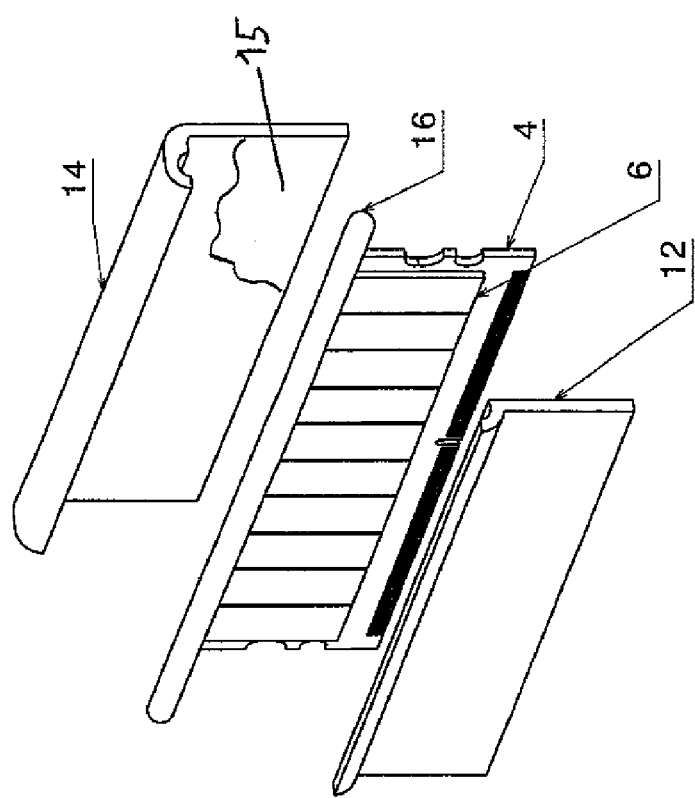
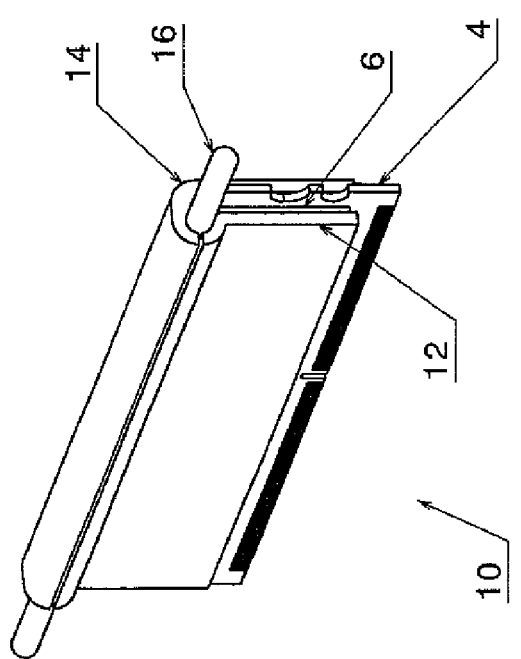
Fig. 3B
Fig. 3A

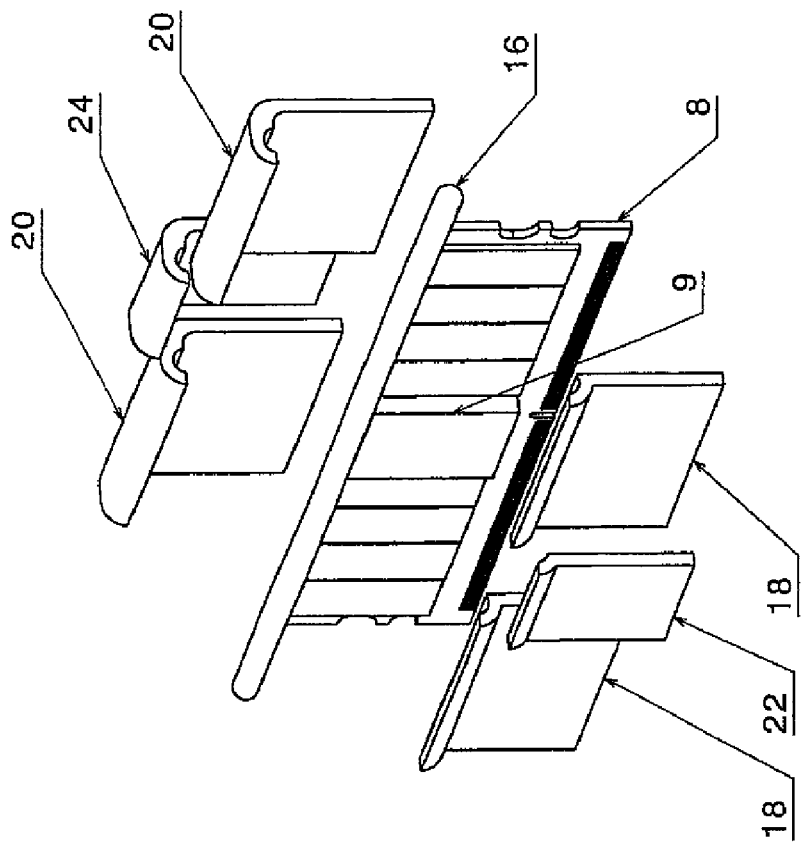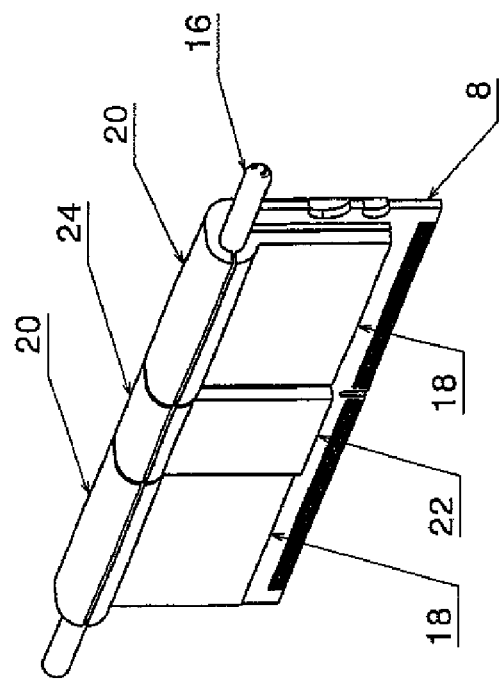
Fig. 4B
Fig. 4A

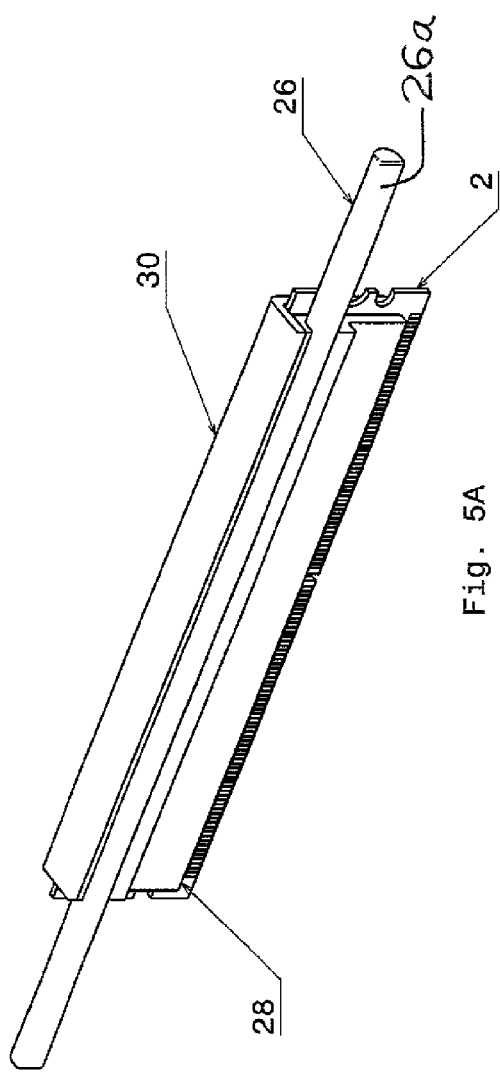
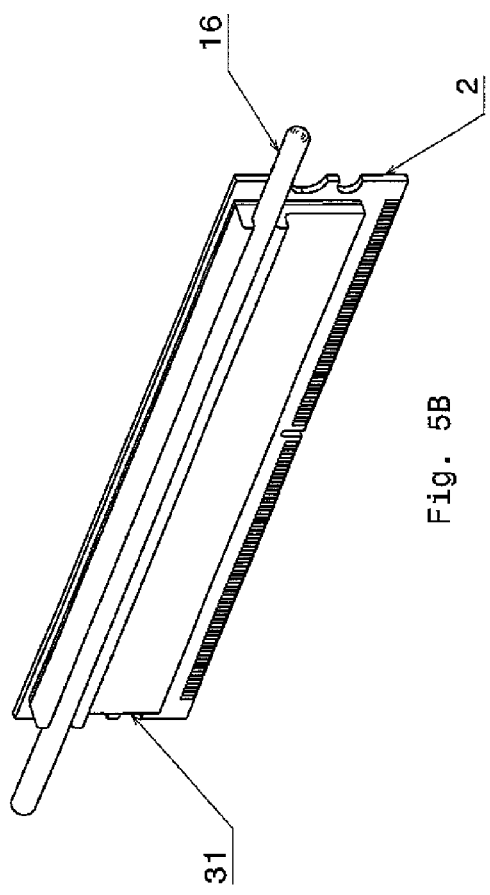

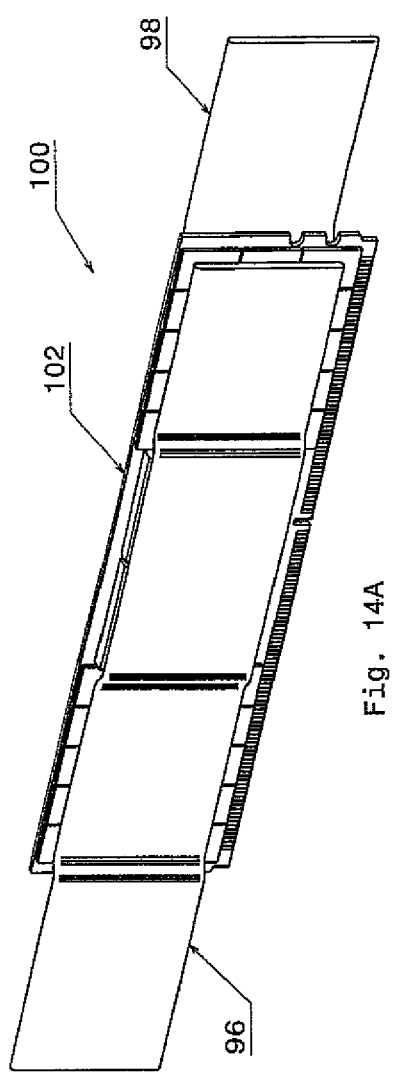
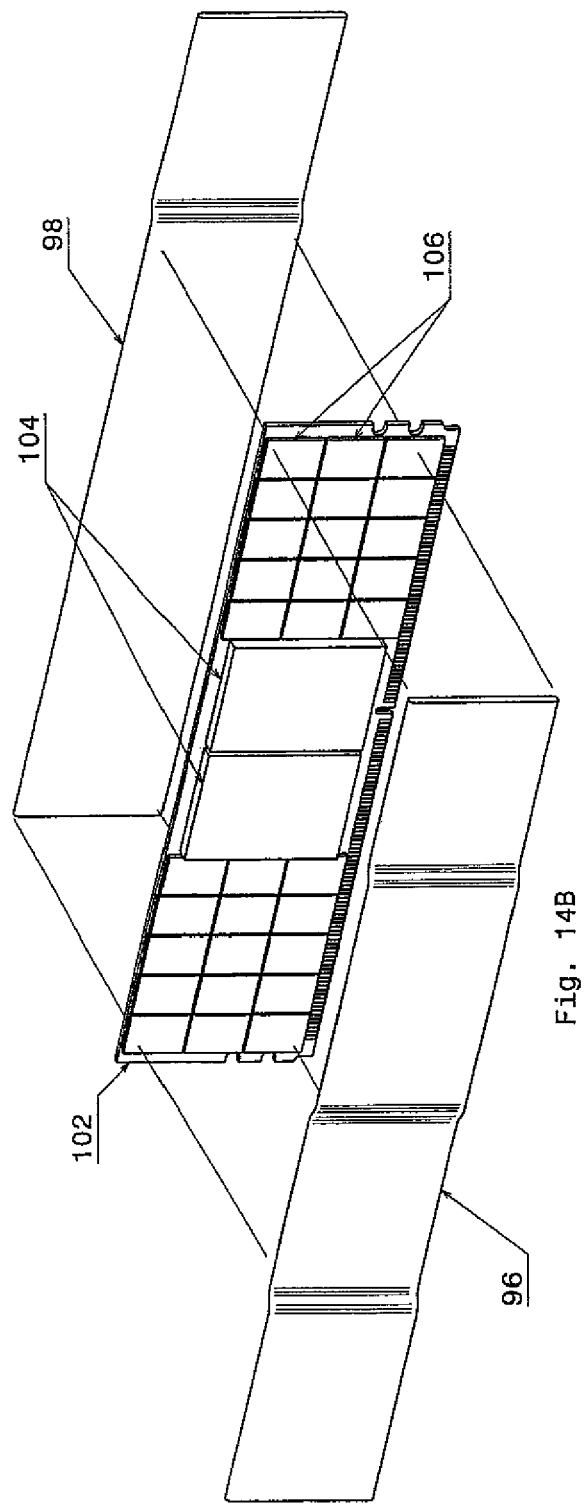
Fig. 14A
Fig. 14B

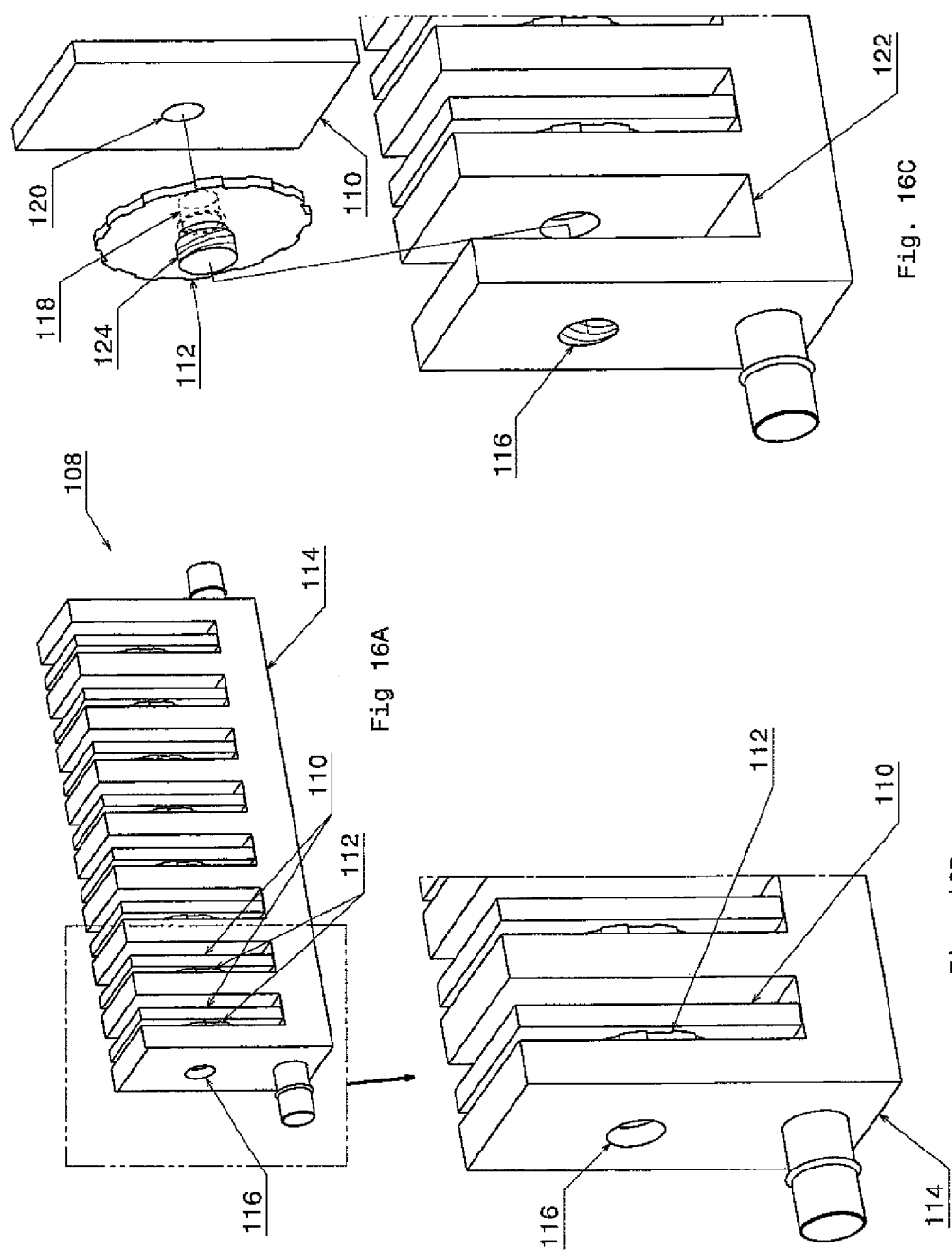

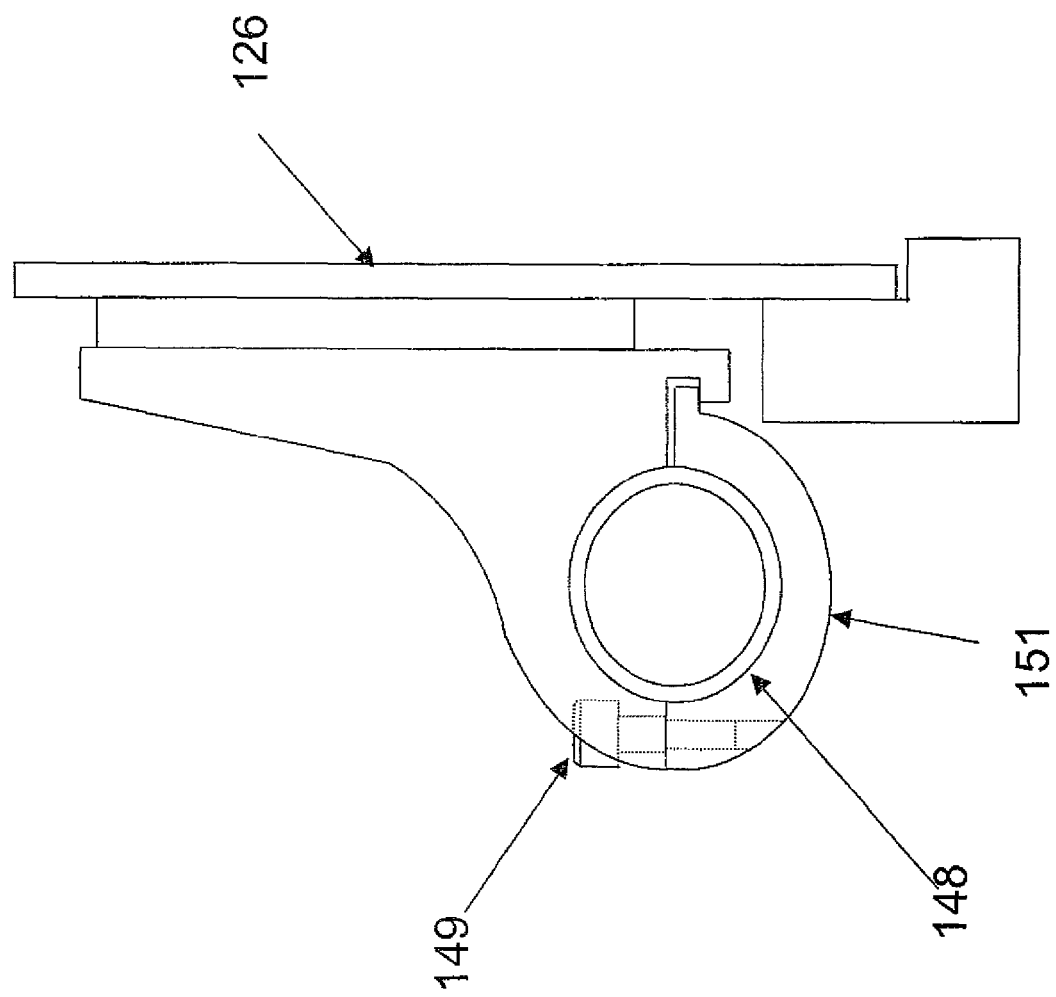

METHOD AND APPARATUS OF WATER COOLING SEVERAL PARALLEL CIRCUIT CARDS EACH CONTAINING SEVERAL CHIP PACKAGES

This invention was made with Government support under Contract No. HR0011-07-9-0002 awarded by Defense Advanced Research Projects Agency (DARPA). The Government has certain rights in this invention.

FIELD OF THE INVENTION

The present invention is related to apparatuses and methods for cooling an electronic device, and more specifically, cooling a heat producing electronic device using heat transfer devices.

BACKGROUND OF THE INVENTION

Cooling for electronic devices, for example, closely spaced electronic circuit cards with nearly uniform height components, such as dual in-line memory modules (DIMMs), has traditionally been accomplished by circulating air. However, in the electronics industry, more powerful circuits are difficult to cool using air cooling and even for relatively low-power devices air cooling can be inadequate. Alternative cooling methods include using a one piece flat sheet metal heat sink. Although such enhancements to air cooling remove additionally heat, they have proved to be inadequate for providing the additional cooling need for more powerful heat producing electronic devices.

Typically, in order to cool known electronic devices air is blown parallel to a plurality of device, such as a plurality of DIMMs shown in FIGS. 1 and 2. It is particularly difficult to cool these devices in any other manner, for example water cooling, because the heat produced by the DRAMs is spread evenly over the several DRAMs and there is limited space between them. Water cooling lends itself to a concentrated heat source, thus current cooling systems are unable to take advantage of water cooling.

Another shortcoming with prior art devices is the inability to conveniently remove and replace a device that is liquid cooled. Liquid cooling typically requires a thermal interface material (TIM) to be applied between the device to be cooled and a heat transfer device such as cold plate or heat sink. The application of this material must be done in a very controlled manner in order to make good thermal contact between the device to be cooled and the cold plate. The level of control needed is usually beyond what can be done in the field, so an individual liquid cooled device cannot easily be replaced in the field. The alternative to breaking the thermal connection to remove a device is to break a liquid connection such as a hose connection. Connections such as these take up a considerable volume of space. While practical for one or a few devices, having an individual liquid disconnect for many devices uses too much room, making this solution impractical.

It would therefore be desirable to provide an apparatus and method for using liquid cooling for removing heat from a heat producing electronic devices such as a circuit card with memory modules. It would also be desirable to provide a method of liquid cooling a plurality of electronics devices such as several parallel circuit cards each containing several chip packages while allowing the circuit cards to be replaced in the field, and further without disturbing any liquid (e.g., water) connections.

SUMMARY OF THE INVENTION

A cooling apparatus for an electronic device including a plurality of heat producing electronic devices affixed to a wiring substrate. A heat transfer device is connected to the heat producing electronic devices and thermally communicating with the heat producing electronic devices for transferring heat from the heat producing electronic devices to the heat transfer device. A heat conduit is connected to the heat transfer device, and the heat conduit thermally communicates with the heat transfer device for transferring heat to the heat conduit from the heat transfer device. A cooling housing is connected to the heat conduit, and the cooling housing defines at least one passageway for circulating thermally conductive fluid. The cooling housing thermally communicates with the heat conduit for transferring heat to the fluid of the cooling housing from the heat conduit.

In a related aspect, the heat conduit transports thermally conductive fluid therethrough for transferring heat to the fluid from the heat transfer device, and the cooling housing circulates a liquid as the fluid through the heat conduit and the cooling housing. The heat conduit may be a closed loop and include a fluid therein for thermally conducting heat from the heat transfer device to the fluid, and the cooling housing defines at least one passageway for circulating fluid in a closed loop, and conductively transferring heat from the heat conduit fluid to the cooling housing fluid. The heat conduit fluid may be a liquid which condenses after evaporating when the heat conduit fluid temperature decreases after heat from the heat conduit fluid is transferred to the cooling housing fluid. The heat producing electronic devices may include memory modules having a plurality of memory chips attached thereon. The apparatus may further include a thermal interface element between the heat producing electronic devices and the heat transfer device. The apparatus may further include a thermal interface element between the heat transfer device and the heat conduit. The apparatus may further include a thermal interface element between the heat producing devices and the heat transfer device. Further, a plurality of heat transfer devices may each mate with and thermally communicate with different portions of the heat producing electronic devices, and the different portions of the heat producing devices have differing dimensions. The heat transfer device may be connected to a front portion of the heat producing electronic devices. The heat transfer devices may be attached to front and back areas of the heat producing electronic devices. The apparatus may further include a printed circuit board (PCB) having the heat producing electronic devices attached thereto and the cooling housing attached to the PCB. The cooling housing may extend along the PCB with heat producing electronic devices on both sides thermally communicating with the cooling housing. The cooling housings may be positioned at opposite ends of the heat producing electronic devices. The apparatus may further include at least one clamping device for holding the heat conduit in contact with the cooling housing. Also, the apparatus may further include locking mechanisms for clamping each of a plurality of heat conduits into specified locations on the cooling housing. The heat conduit may be substantially cylindrically shaped. Also, the heat conduit may include a planar surface area. The heat conduit may be rectangularly shaped. The heat transfer device may include a curved portion opposite a planar surface area, and the planar surface area contacts the heat producing electronic devices.

In another aspect of the invention, a cooling system for an electronic device includes a plurality of heat producing electronic devices affixed to a substrate; heat transfer devices connected to the heat producing electronic devices and thermally communicating with the heat producing devices for transferring heat from the heat producing devices to the heat transfer devices; a heat conduit connected to the heat transfer devices, the heat conduit thermally communicating with the heat transfer devices for transferring heat to the heat conduit from the heat transfer device, and the heat transfer devices each mate with and thermally communicate with different portions of the heat producing electronic devices, and some of the different portions of the heat producing devices have differing dimensions; and a cooling housing connected to the heat conduit using clamping devices for holding the heat conduit in contact with the cooling housing, the cooling housing defines at least one passageway for circulating thermally conductive fluid, and the cooling housing thermally communicating with the heat conduit for transferring heat to the fluid of the cooling housing from the heat conduit. The apparatus may further include heat producing electronic devices each including a plurality of computer memory chips.

In another aspect of the invention, a method of cooling an electronic device includes: providing at least one heat producing electronic device; transferring heat from the heat producing device to a heat transfer device, the heat transfer device being connected to and thermally communicating with the heat producing device; transferring heat to a heat conduit from the heat transfer device, the heat conduit being connected to and thermally communicating with the heat transfer device; and transferring heat from the heat conduit to a fluid of a cooling housing, the cooling housing being connected to and thermally communicating with the heat conduit.

BRIEF DESCRIPTION OF THE DRAWINGS

These and other objects, features and advantages of the present invention will become apparent from the following detailed description of illustrative embodiments thereof, which is to be read in connection with the accompanying drawings, in which:

FIGS. 3A and 3B are perspective views illustrating a DIMM as shown in FIG. 1 to which has been added a heat spreader and a heat pipe according to the invention, and includes a thermally conductive adhesive in FIG. 3B;

FIGS. 4A and 4B are perspective views illustrating a DIMM as shown in FIG. 2 to which has been added several heat spreaders to accommodate several chip package heights and a heat pipe according to the invention, with FIG. 4B depicting an exploded view of the assembly shown in FIG. 4A;

FIGS. 5A and 5B are perspective views illustrating two other embodiments of a DIMM as shown in FIG. 1 to which has been added a heat spreader and a heat pipe;

FIGS. 14A and 14B are perspective views of an assembly similar to FIG. 4 but illustrating another embodiment of a heat spreader/heat pipe attachment, having a flat heat pipe used in place of a heat spreader and round heat pipe;

FIGS. 16A, 16B and 16C are perspective views illustrating the details of the heat pipe clamping to the water jacket as shown in FIG. 15;

FIGS. 18 through 22 are perspective and side elevational views, respectively, illustrating another embodiment of the invention where instead of breaking the thermal connection between the heat pipe and the water jacket when removing a circuit card the break is made between the heat spreader and the heat pipe;

FIG. 18 is a perspective view illustrating the mother printed circuit board and heat transfer components with all the daughter circuit cards removed;

FIG. 19 is a perspective view illustrating the mother printed circuit board as in FIG. 18 but with one daughter circuit card plugged in and one daughter circuit card above its plugged in position;

FIG. 21 is a perspective view illustrating the mother circuit card as in FIG. 18 but with all the daughter circuit cards plugged in but not clamped to the heat pipes;

FIG. 22 is a perspective view illustrating the mother circuit card as in FIG. 19 with all the daughter circuit cards plugged in but and clamped to the heat pipes;

FIG. 24 is a side elevational view of an alternative embodiment of the invention for clamping the heat spreader to the heat pipe.

DETAILED DESCRIPTION OF THE INVENTION

Illustrative embodiments of the present invention are described herein with reference to FIGS. 1-23 for apparatuses and methods of cooling heat producing electronic devices. For example, the apparatuses provide cooling for several parallel circuit cards including chip packages while allowing the circuit cards to be replaced in the field and further without disturbing any fluid or liquid (e.g., water) connections.

Figure 1:
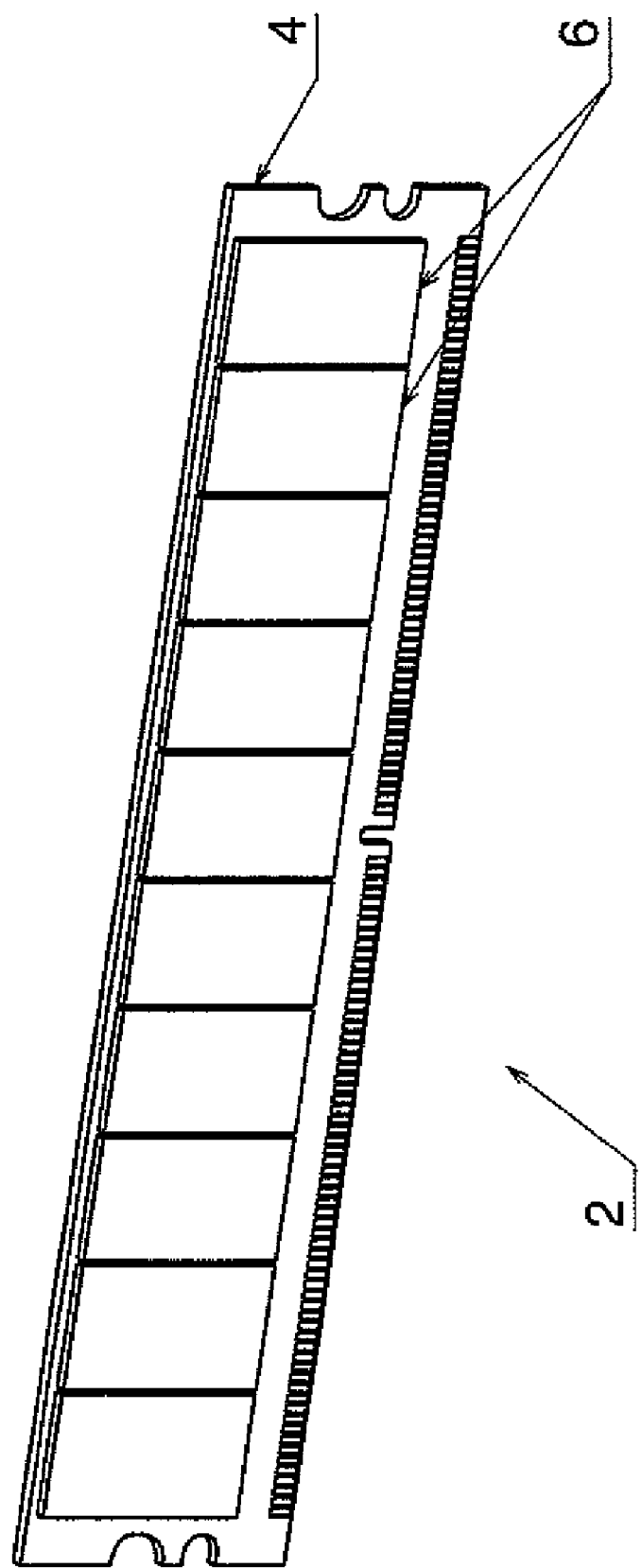
FIG. 1 is a perspective view illustrating a typical dual in-line memory module (DIMM) containing several dynamic random access memory (DRAM) chips.

Referring to FIG. 1, an illustrative embodiment of a heat producing electronic device is a typical dual in-line memory module (DIMM) 2 that is used in computers. The DIMM includes a circuit card 4 and several dynamic random access memory chips (DRAMs) 6. Several of these DIMMs 2 are typically plugged into a computer processor printed circuit board in a parallel manner and in close proximity to each other, typically about 12 mm apart.

Figure 2:
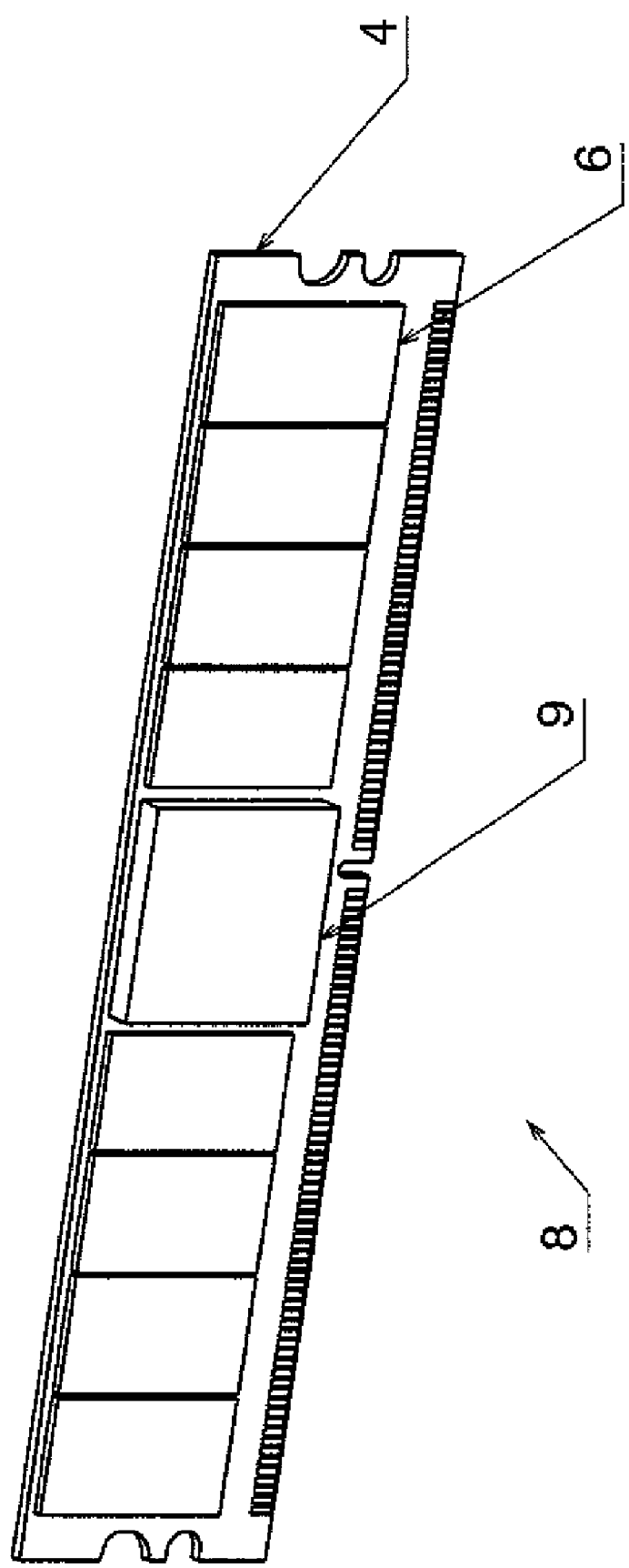
FIG. 2 is a perspective view illustrating another typical dual in-line memory module (DIMM) that contains a controller chip which is a different size from the dynamic random access memory (DRAM) chips.

Another embodiment of a DIMM 8 is shown in FIG. 2, wherein in addition to the DRAMs 6, a memory controller chip package 9 is added to the circuit card 4. This DIMM 8 may be used for higher-performance memory systems. Referring to FIGS. 3A and 3B, a DIMM 2 has been assembled with a heat transfer device embodied as heat spreaders 12 and 14 and a heat conduit embodied as a heat pipe 16 in accordance with the invention. The components, heat spreaders 12, 14, are shown separated in the exploded view in FIG. 3B. Other embodiments of heat transfer devices and heat conduits may be used and may include, heat sinks and heat conductors, e.g., metal conductors or heat conductor devices including a liquid for conduction. Alternative embodiments of heat transfer devices and heat conduits are discussed herein and shown in the accompanying figures. In order for heat to be efficiently transferred from the DRAMS 6 to the heat spreaders 12 and 14, a thermal interface material, such as a filled silicone, epoxy, or other filled polymer adhesive 15 shown in FIG. 3B is used. The heat spreaders 12, 14 may be attached to the DRAM 6 using a high-thermal-conductivity filled adhesive. The application of the thermal adhesive 15 must be carefully controlled, and thus is impractical to perform in the field. As an alternative, a non-rigid thermal adhesive or a compliant thermal interface material (TIM) such as a pad or gap fill material may be used between the DRAM 6 and the heat spreaders 12, 14.

Similarly, the heat pipe 16 and heat spreaders 12, 14 also have a thermal interface material (not shown) between them for enhancing heat transfer. For example, thermally conductive oils or pastes, cured or partially cured filled polymers, phase change materials, etc., may be used for enhancing heat transfer. A thermally conductive epoxy adhesive could be used as well.

In the case where a DIMM 8 has a memory controller chip package 9 attached (FIG. 2), the surfaces of the controller chip 9 and the DRAMs 6 may be at different heights. While heat spreaders such as 12, 14 can be modified by machining to accommodate the differences in heights, an alternative means is to use several different heat spreaders such as 18, 20, 22, and 24 shown in FIGS. 4A and 4B.

Another variation of the DIMM 8, heat spreaders 12, 14 and heat pipe 16 is shown in FIG. 5A which illustrates a large diameter heat pipe 26 that has been flattened on one side 26a to accommodate space constraints and heat spreaders 28, 30 are adapted to mate with the heat pipe 26. Referring to FIG. 5B, a heat spreader 31 that only touches the front of the DIMM 2 is illustrated. In this case, the heat removed is less than when the heat spreader touches both sides of the DIMM 2.

Figure 9:
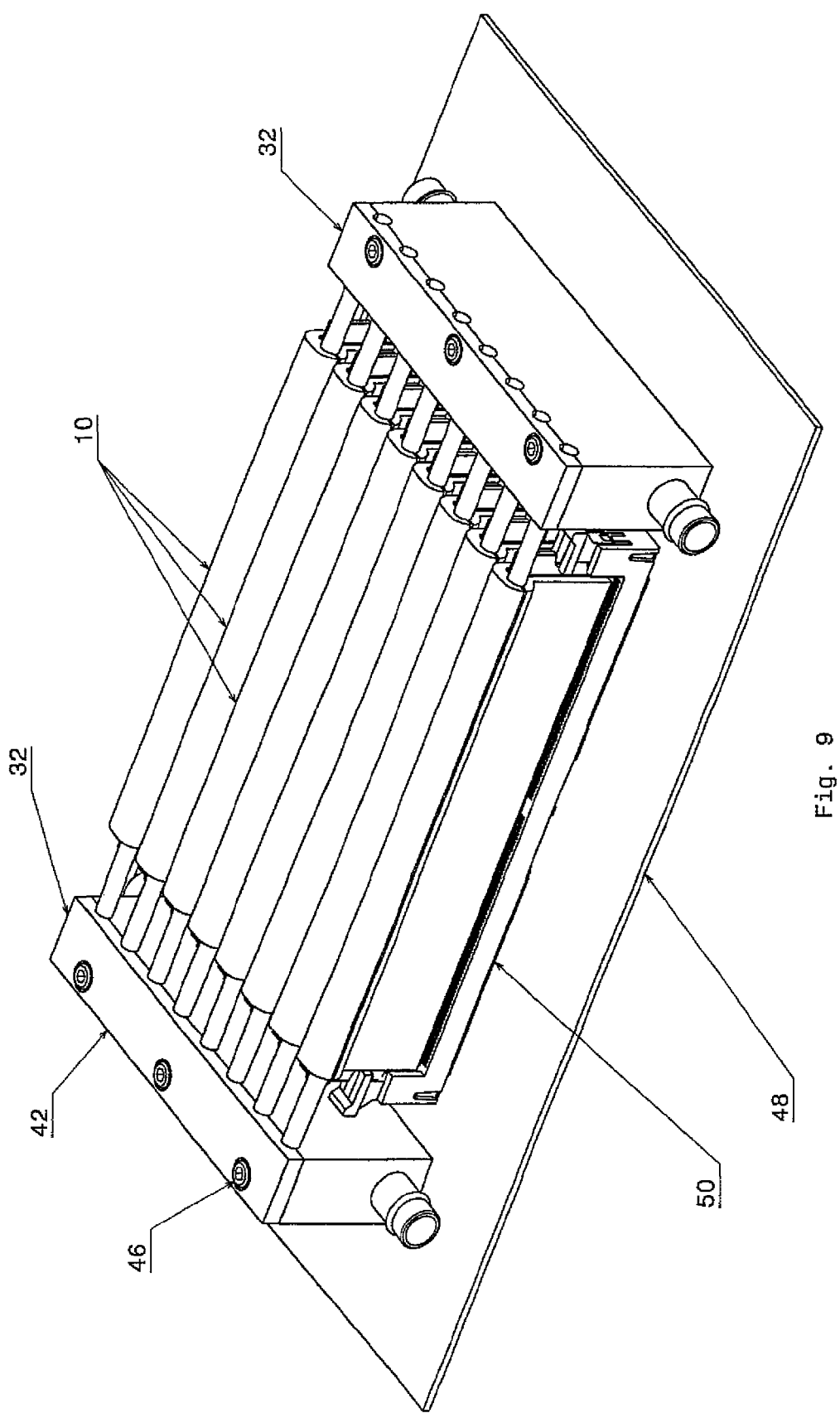
FIG. 9 is a perspective view illustrating a typical printed circuit board as shown in FIG. 8 but with all DIMMs plugged in and the heat pipe retainers in place.

Referring to FIGS. 3A, 3B, and 9, the heat pipe 16 transfers heat between the heat spreaders 12, 14 and the water jacket 32 by the evaporation and condensation of an internal fluid, e.g., water. The heat pipe 16 in the embodiment shown in FIG. 9 is a closed loop, for example, a sealed metal tube. The sealed metal tube, i.e., heat pipe 16 may include an inner lining of wicklike capillary material and the internal fluid for facilitating the evaporation and condensation and redistribution of the internal fluid.

Figure 6:
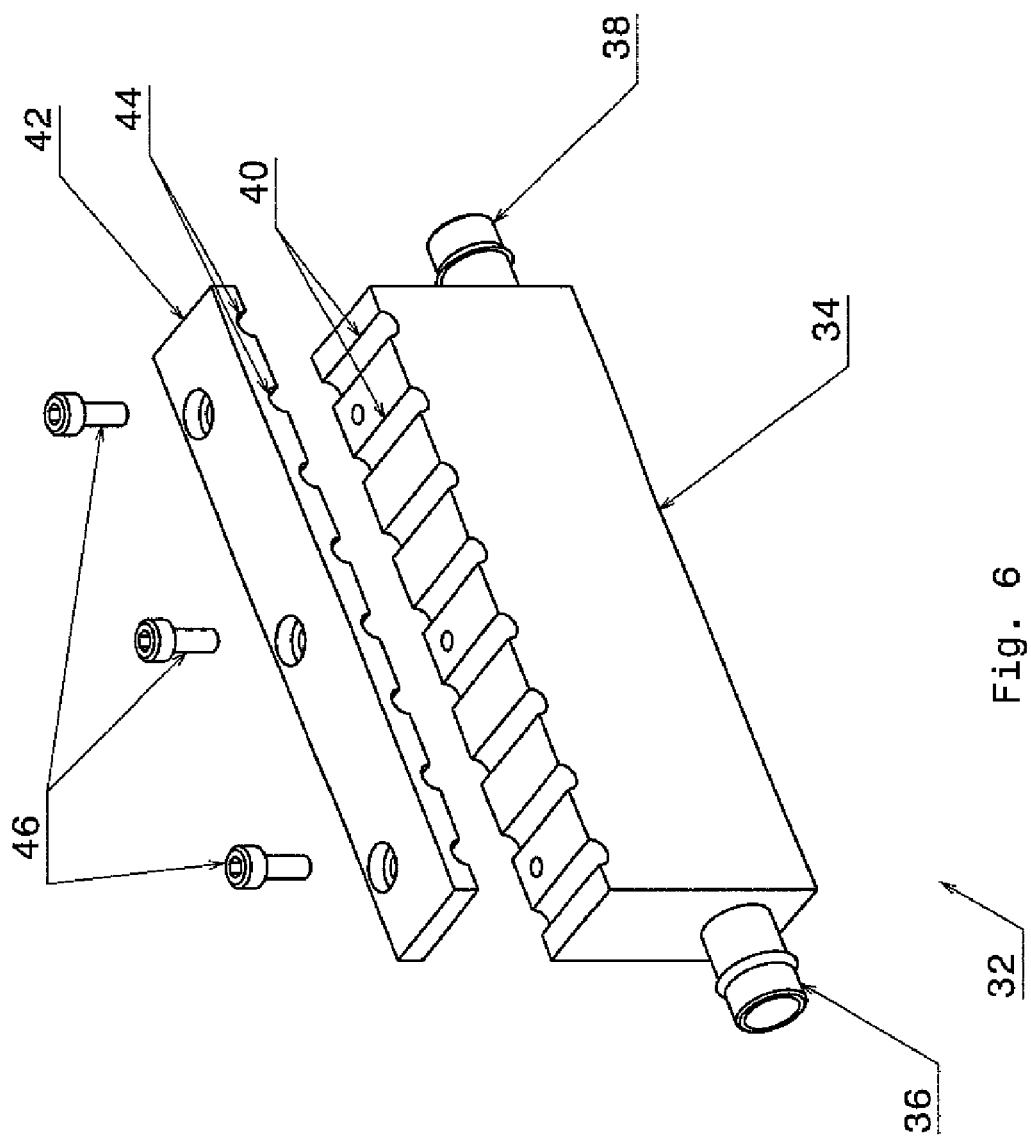
FIG. 6 is an exploded perspective view illustrating a water jacket assembly.
Figure 7:
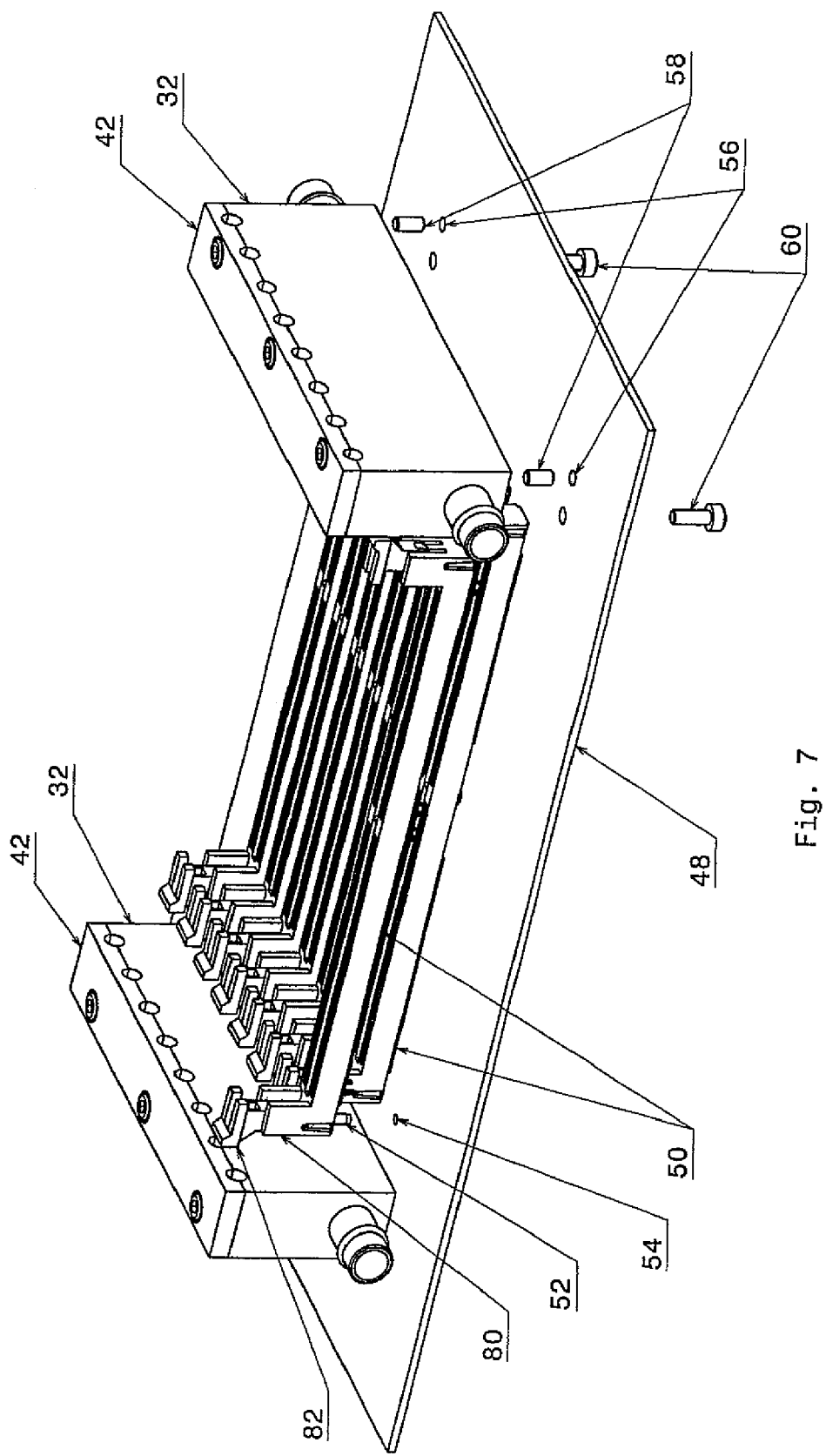
FIG. 7 is a perspective view illustrating a typical printed circuit board with DIMM connectors and water jackets.

Referring to FIG. 6, a cooling housing embodied as a water jacket assembly 32 consisting of a body 34, an inlet hose connection 36, an outlet hose connection 38, and a continuous hole connecting the hose connections so water or other liquids can flow through the water jacket. Alternatively, other fluids, e.g., a dielectric fluid either as a liquid, or as a mixture of liquid and vapor phases, or a gas can also flow through a cooling housing. The body 34 has a series of half holes 40 that accommodate, for example, round heat pipes. Finally a clamping device 42 also with a series of matching half holes 44 is attached to the body 34 by way of fasteners 46. Referring to FIG. 7, when the water jacket assembly 32 is assembled as shown, the half holes 40, 44 align to form a series of round holes equal to or slightly smaller than the diameter of the heat pipe 16. When heat pipes are clamped in these holes as shown in FIG. 9, a thermal interface is made due to the tight fit between the heat pipes and the holes. It is this thermal interface that is broken when the DIMM assembly 10 is removed in the field and replaced with another one. The tight fit of the heat pipe to the split holes in the water jacket assembly not only provides a thermal interface, but is one that can be made easily and in the field. Alternatively, an oil layer can be added, or a thermal pad or gap fill material can be used if desired. The assembly shown in FIG. 7, shows a portion of a circuit board 48 contains a number of DIMM connectors 50 and two water jacket assemblies 32. One DIMM connector 50 and one water jacket assembly 32 is illustrated lifted above its normal position to show details of aligning them to the circuit board 48. Commercially available DIMM connectors 50 have a molded pin 52 on the bottom that fit into a hole 54 drilled in the circuit board 48. Likewise, holes 56 are also drilled in circuit board 48 which locates water jackets 32 by way of locating pins 58. Because circuit boards such as 48 illustrated here are drilled on numerically controlled machines, these holes are very precisely located and therefore the relative locations of the connectors 50 and the water jacket assemblies 32 are precisely located relative to each other. If the clamping device 42 is removed from each water jacket assembly 32 the circuit card would be ready to plug in DIMM assemblies 10 into the connectors 50 whereas the heat pipes 16 fall into place in the half holes 40 of the water jacket body 34.

Figure 8:
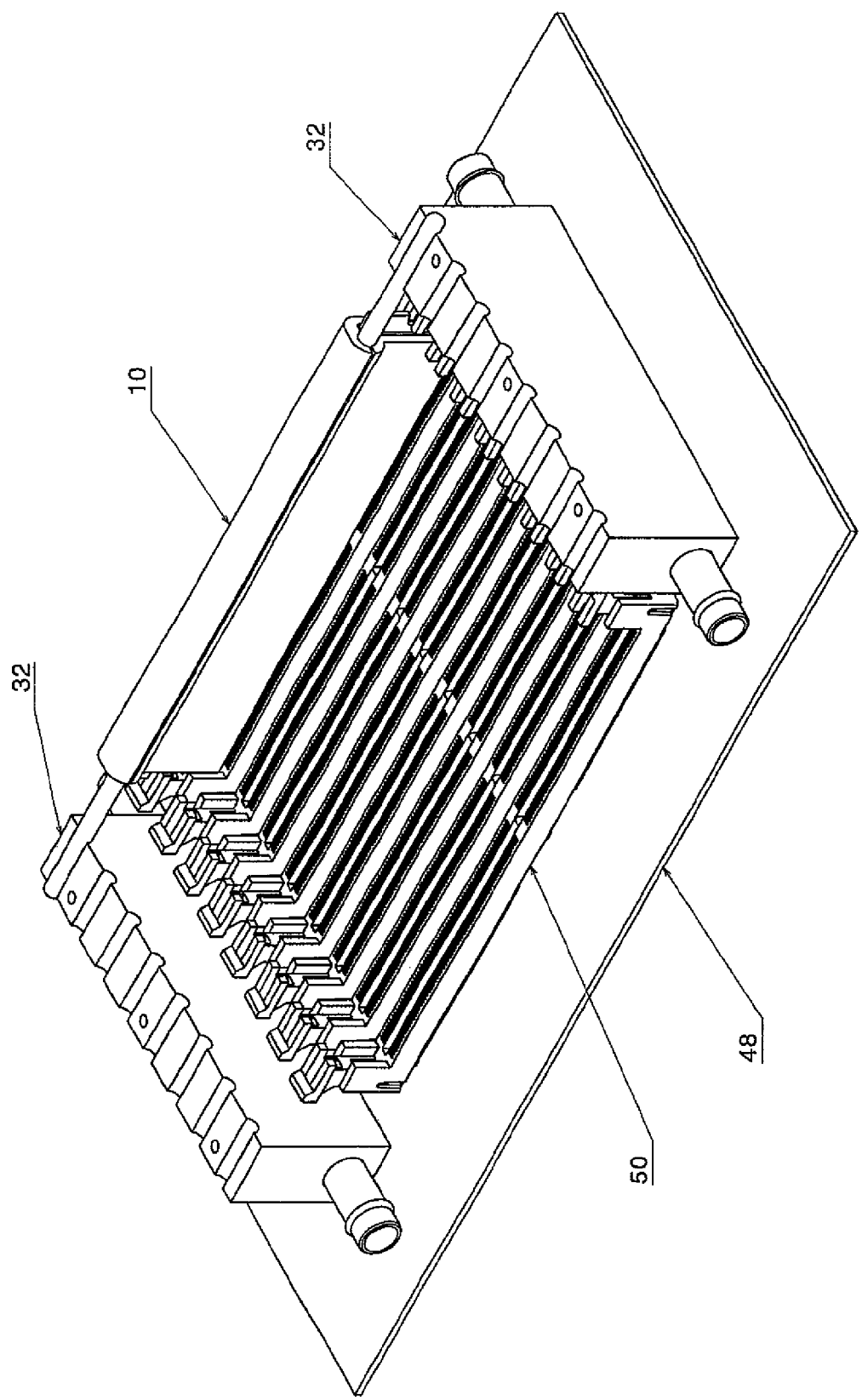
FIG. 8 is a perspective view illustrating a typical printed circuit board as shown in FIG. 7 but with a single DIMM with heat spreader and heat pipe plugged into a DIMM connector.

Referring to FIGS. 8 and 9, the DIMM assemblies 10 are placed into their respective connectors as shown in FIG. 9. After all the DIMM assemblies are placed in their respective connectors, the clamping devices 42 are fastened by way of fasteners 46 and all the heat pipes are clamped in the water jacket assemblies 32. This method of clamping makes a superior thermal interface of the water jacket assemblies 32 and the heat pipes 16. An advantage to this type of connection is that it can also be made in the field, thus enabling field replacement of individual DIMM assemblies 10. Thermal interfaces that involve thermal paste, or thermal adhesives cannot be made in the field because of the necessary precise process controls. Alternatively, a thermal oil, thermal pad or gap fill material can be used if desired.

Figure 10:
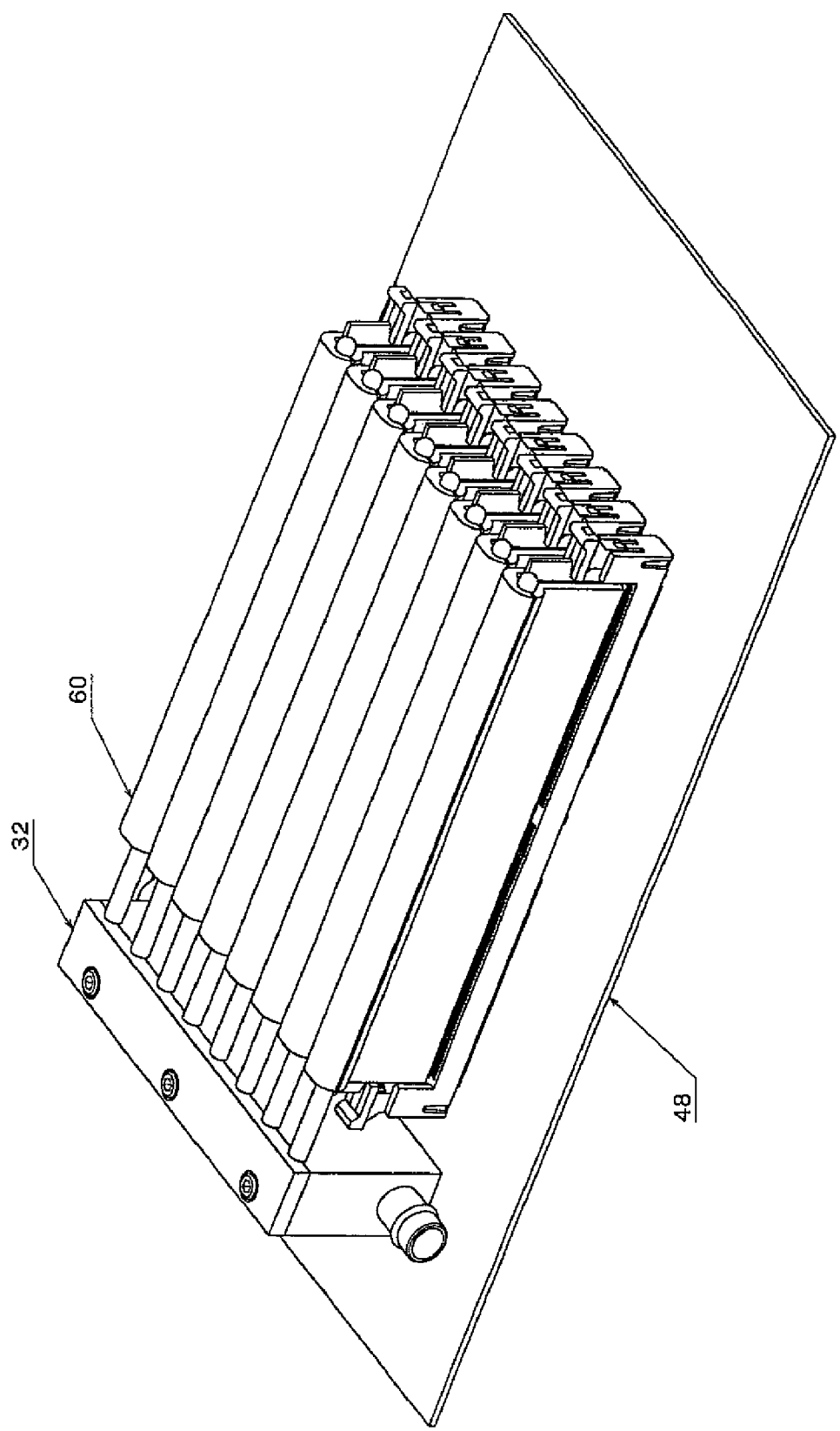
FIG. 10 is a perspective view illustrating another embodiment of what is shown in FIG. 9.
Figure 11:
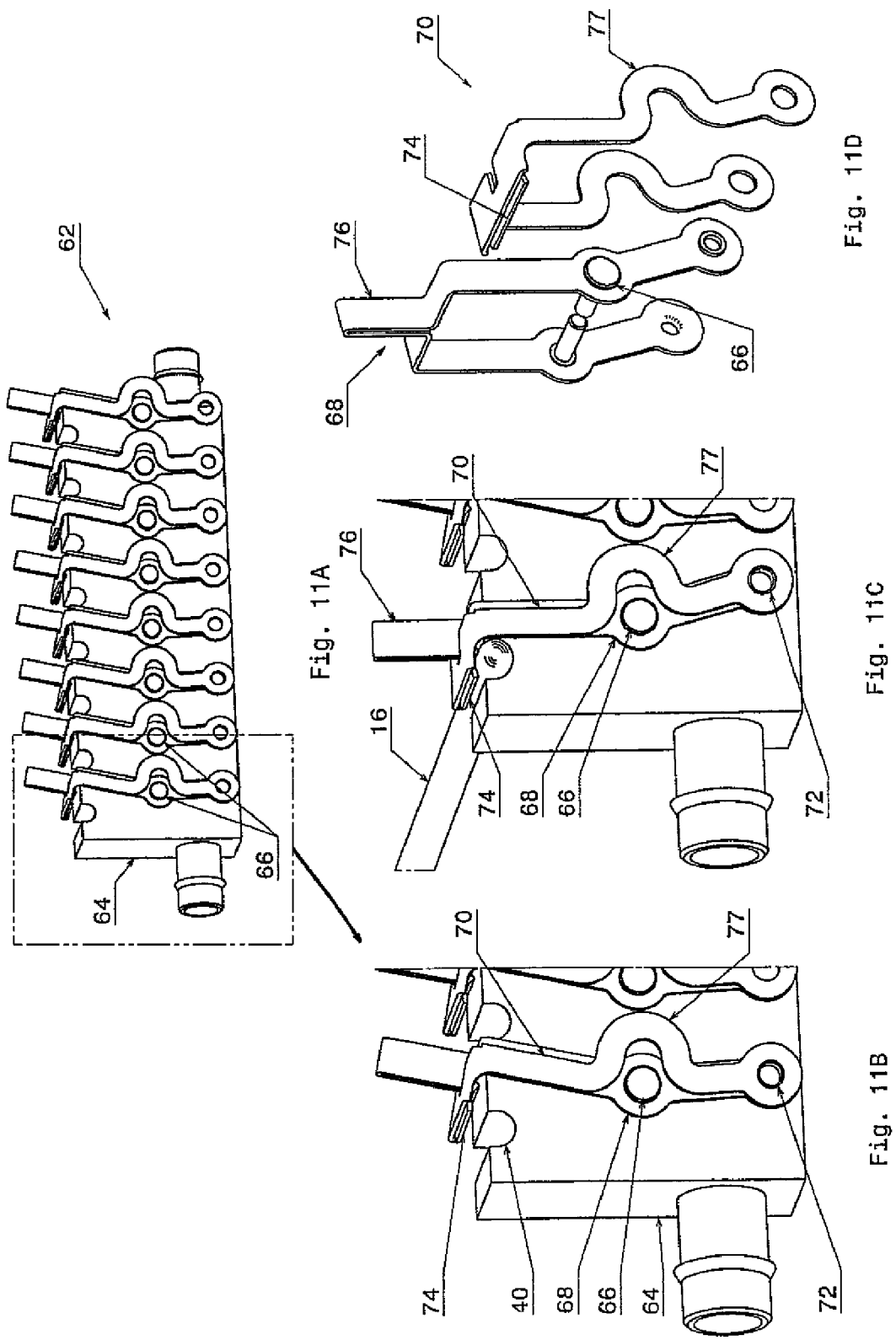
FIGS. 11A, 11B, 11C and 11D are perspective views illustrating another embodiment of a method of clamping heat pipes to a water jacket.

FIG. 10 shows another embodiment of the invention described in FIGS. 8-9. In lower-power DIMMs it is possible to remove sufficient heat using a water jacket assembly on one end. In this case a DIMM assembly 60 is constructed similar to DIMM assembly 10 but with a heat pipe protruding from only one side. Only one water jacket assembly 32 is then used. In an even lower power application a combination can be used consisting of a heat pipe that protrudes from one end of the DIMM as shown in FIG. 10 and a heat spreader that touches only one side of the DIMM card as shown in FIG. 5B. The above embodiments describe a method of clamping heat pipes 16 to the water jacket body 34 by means of clamping device 42 and fasteners 46.

Figure 12:
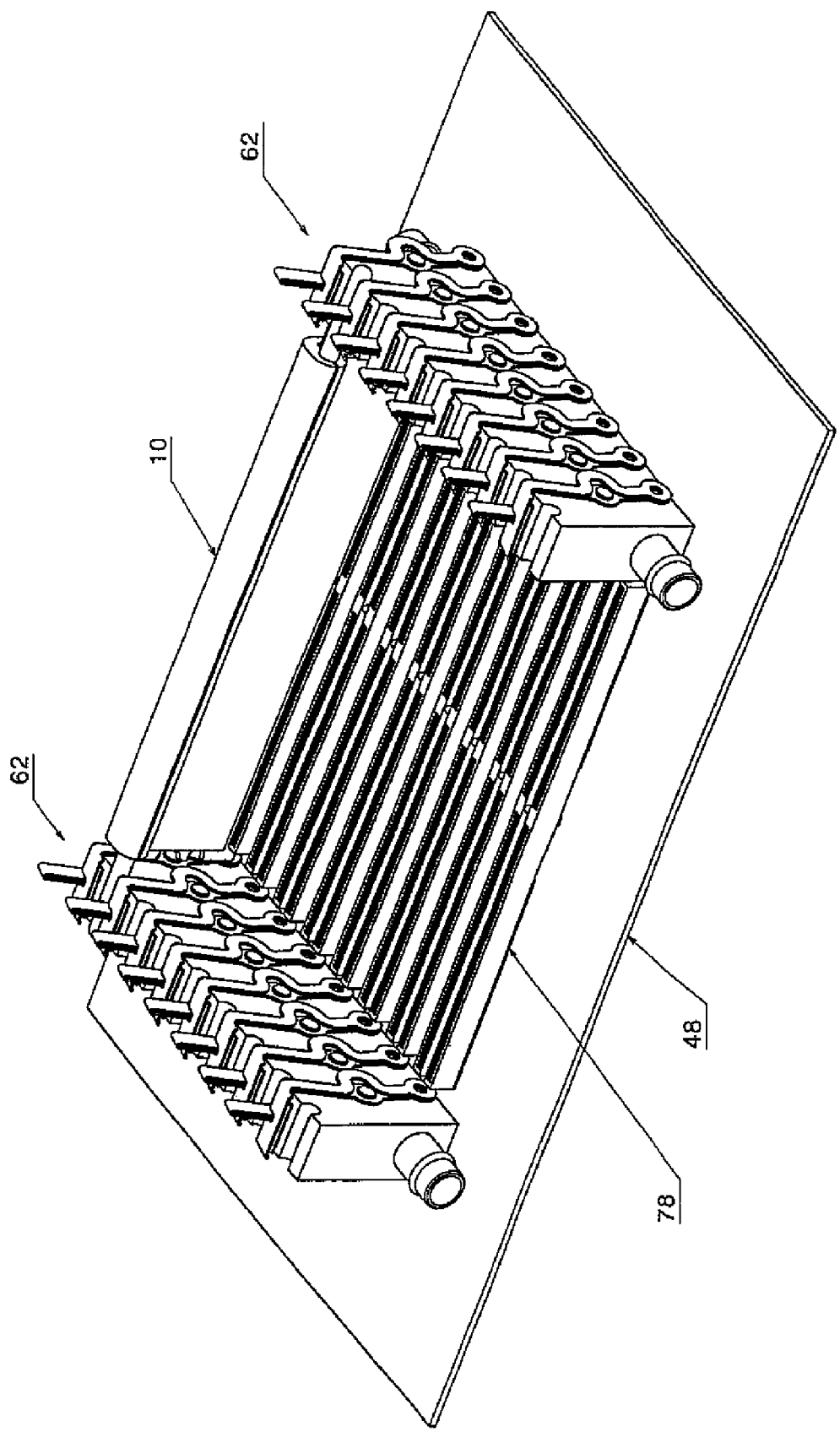
FIG. 12 is a perspective view with an assembly similar to FIG. 8 but with the embodiment of clamping heat pipes to a water jacket as illustrated in FIGS. 11A, 11B, 11C and 11D.

Alternative means of performing the function of clamping heat pipes to the water jacket body are described with reference to FIGS. 11A, 11B, 11C and 11D. A water jacket assembly 62 is shown in FIG. 11A that is similar to water jacket assembly 32 but with a different heat pipe clamping mechanism. The body 64 of the water jacket assembly 62 is similar to the body 34 of water jacket assembly 32 but in addition has pivot pins 66 added to it at the same intervals as the half holes 40. Pivoting on pivot pin 66 is pivot arm 68 shown in FIG. 11B. Pivotally attached to pivot arm 68 is clamp arm 70. Clamp arm 70 pivots relative to pivot arm 68 at point 72. Integral to clamp arm 70 is pressure pad 74. Pivot pin 66, pivot arm 68 and clamp arm 70 are shown in an exploded view for clarity in FIG. 11D. Referring to FIG. 11C, after heat pipe 16 is placed in half hole 40, clamp arm 70 is pivoted forward so pressure pad 74 rests on heat pipe 16, then grasping handle 76 which is part of pivot arm 68, pivot arm 68 pivots forward in the same direction as clamp arm 70. This causes pivot point 72 to be a greater distance from half hole 40 and heat pipe 16 thus "stretching" clamp arm 70 causing a force to be applied downward on heat pipe 16. The deflection and force is controlled by the bend 77 in clamp arm 70. Each clamp can be operated individually thus allowing one DIMM assembly 10 to be removed without disturbing any other. FIG. 12 illustrates the use of water jacket assemblies 62 on circuit card 48 along with DIMM connectors 78. In this illustration a single DIMM assembly 10 has been inserted in DIMM connector 78. Other DIMM assemblies 10 have been left out for clarity. DIMM connector 78 is different from DIMM connector 50 shown in FIG. 7. Commercially available DIMM connectors 50 as shown in FIG. 7 have a card guide 80 and a card locking mechanism 82 on each end of the connector.

Figure 13:
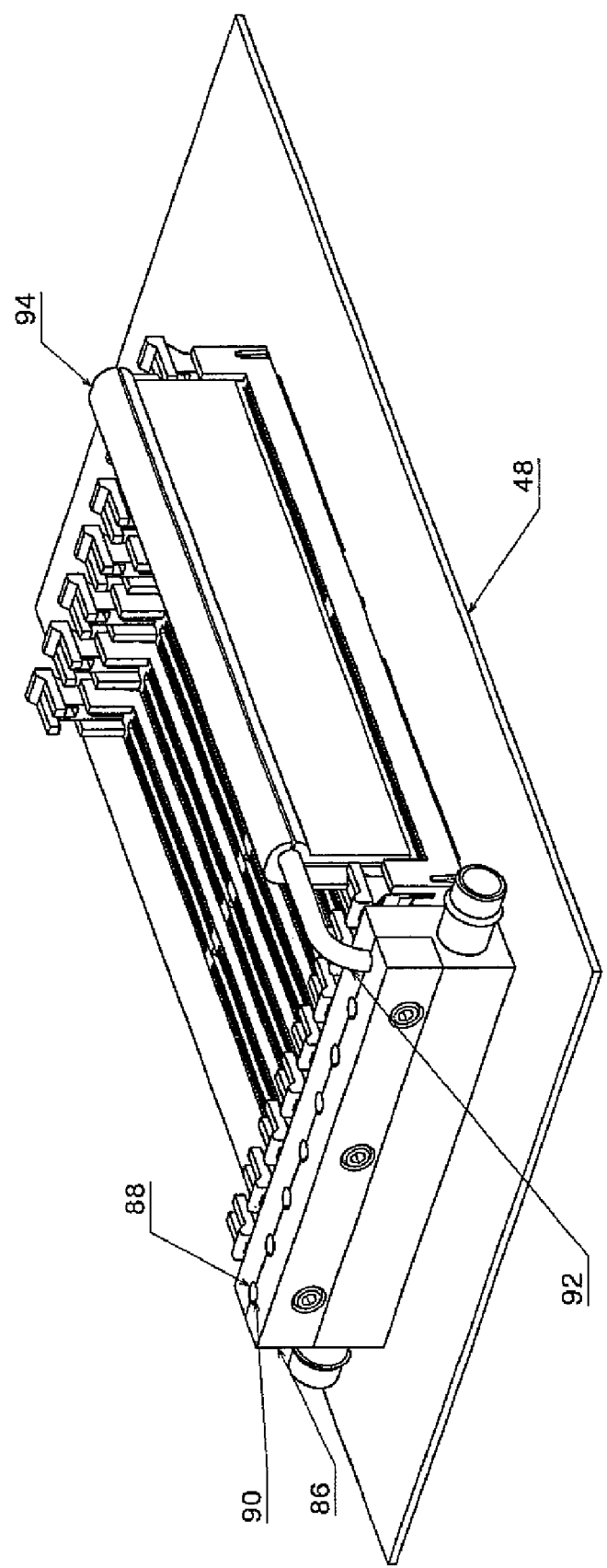
FIG. 13 is a perspective view with an assembly similar to FIG. 10 but illustrating another embodiment of clamping heat pipes to a water jacket.

While FIG. 7 illustrates this invention using connectors with card guides 80 and locking mechanisms 82, however, an embodiment of the invention shown in FIG. 13 makes these parts of the DIMM connector unnecessary. DIMM connectors used with the embodiment of the water jacket assembly shown in FIG. 13 could be constructed without ether of card guides and locking mechanisms and the associated heat pipe clamping mechanism. Referring to FIG. 13, a clamping device 86 is used similar to clamping device 42 on water jacket assembly 32, however, the half holes and clamping device is turned ninety degrees so the half holes 88 and 90 are vertical. In addition, heat pipe 92 is bent ninety degrees. This arrangement allows a DIMM assembly 94 to be removed by simply loosening clamping device 86 instead of fully removing it.

Figure 15:
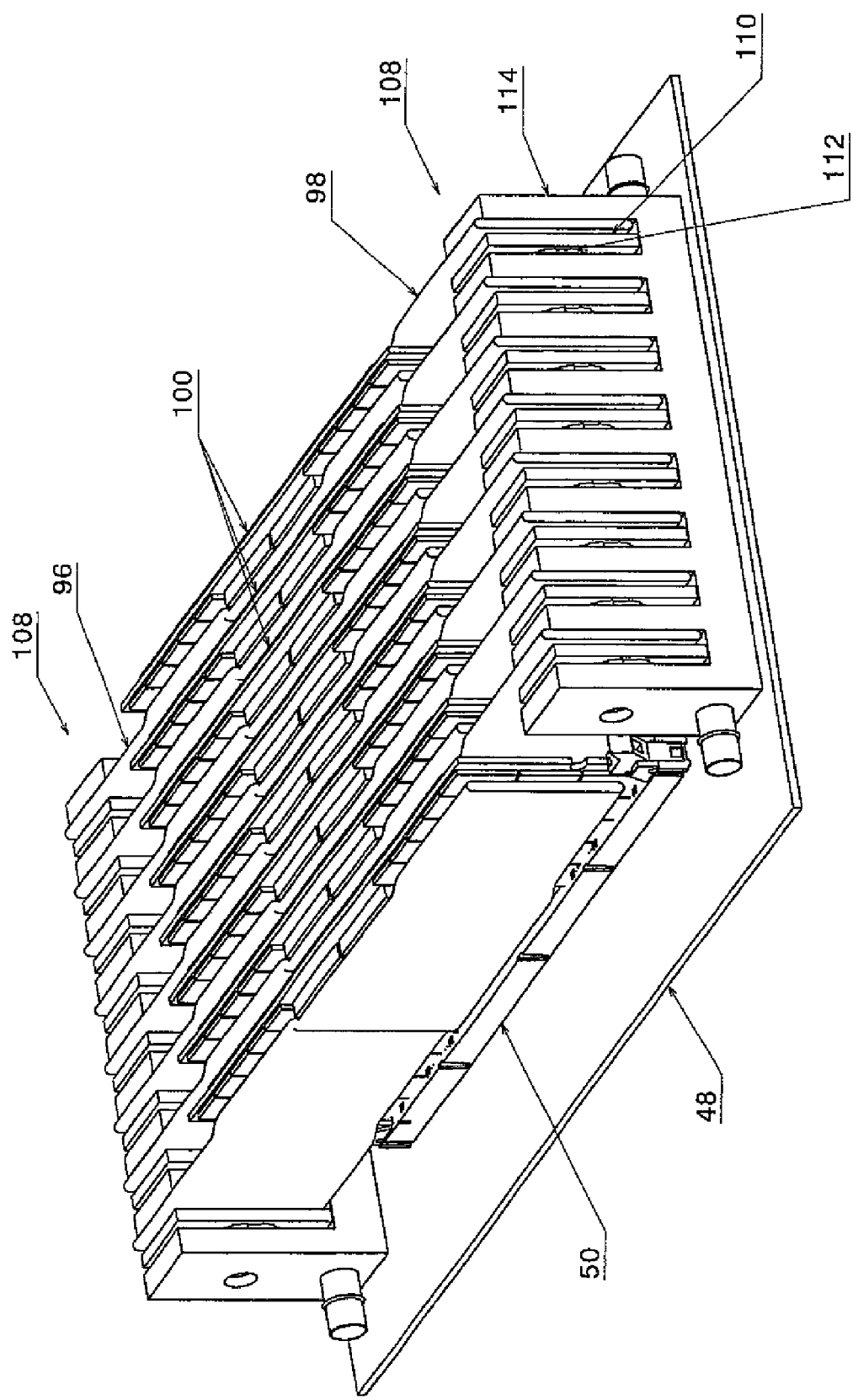
FIG. 15 is a perspective view of an assembly similar to FIG. 9 but showing the embodiment illustrated in FIGS. 14A and 14B.

FIGS. 14A, 14B and 15 illustrate yet another embodiment of this invention. In this case no heat spreader is used, instead, flat heat pipes 96 and 98 are utilized. The heat pipe is typically available in thickness as small as 1.6 millimeters and any width up to 400 millimeters and any length up to 800 millimeters. Referring to FIGS. 14A and 14B, a circuit card assembly 100 includes a DIMM card 102 with two memory controllers 104, but the method works for many different circuit cards, with two flat heat pipes 96 and 98 attached. As can be seen from the FIGS. 14A-15, the heat pipes 96 and 98 can be formed to accommodate different heights of electronic devices such as the memory controllers 104 and DRAMS 106.

Referring to FIG. 15, a portion of a mother board 48 with DIMM connectors 50 includes another embodiment of water-jacket assemblies 108 that accommodate circuit card assemblies 100. More details of the water-jacket assembly 108 are shown in FIGS. 16A, 16B and 16C. Referring to FIGS. 16A, 16B, an overall view of water-jacket assembly 108 includes several clamp plates 110 and several thumb wheel actuators 112. The water jacket body 114 is a comb-like structure with a threaded hole 116 running the entire length of the water jacket body 114. Referring to FIG. 16C, which is an exploded illustration of FIG. 16B, thumb wheel 112 has a pilot shaft 118 that fits in the hole 120 in clamp plate 110 and can slide axially in hole 120. This is for locating the clamp plate 110 in the radial direction of the thumb screw 112. Clamp plate 110 and thumb wheel 112 are assembled by placing pilot shaft 118 in the hole 120 of the clamp plate 110 and then placed in a cavity 122 of water jacket 114. The threaded shaft 124 opposite the pilot shaft 118 on thumb wheel 112 is threaded into threaded hole 116 on water jacket body 114. This assembly is done for all of the several cavities 122 on water jacket body 114. Referring to FIG. 15, with circuit card assembly 100 placed in connector 50, heat pipes 96, 98 fall between clamp plate 110 and a vertical wall of water jacket body 114. Turning the thumb wheel 112 forces clamp plate 110 to apply pressure against heat pipes 96 or 98 forcing them against a wall of the water jacket body 114. The pressure provides superior thermal interface between the heat pipes 96, 98 and the water jacket body 114. This interface could be improved if necessary by placing a thermal interface material (TIM), well known in the art, between the heat pipes 96 or 98 and water jacket body 114. For the lower power circuit card assemblies 100, all the necessary heat may be removed by using a heat pipe on one side of the circuit card assembly and using only one water jacket assembly 108.

Figure 17B:
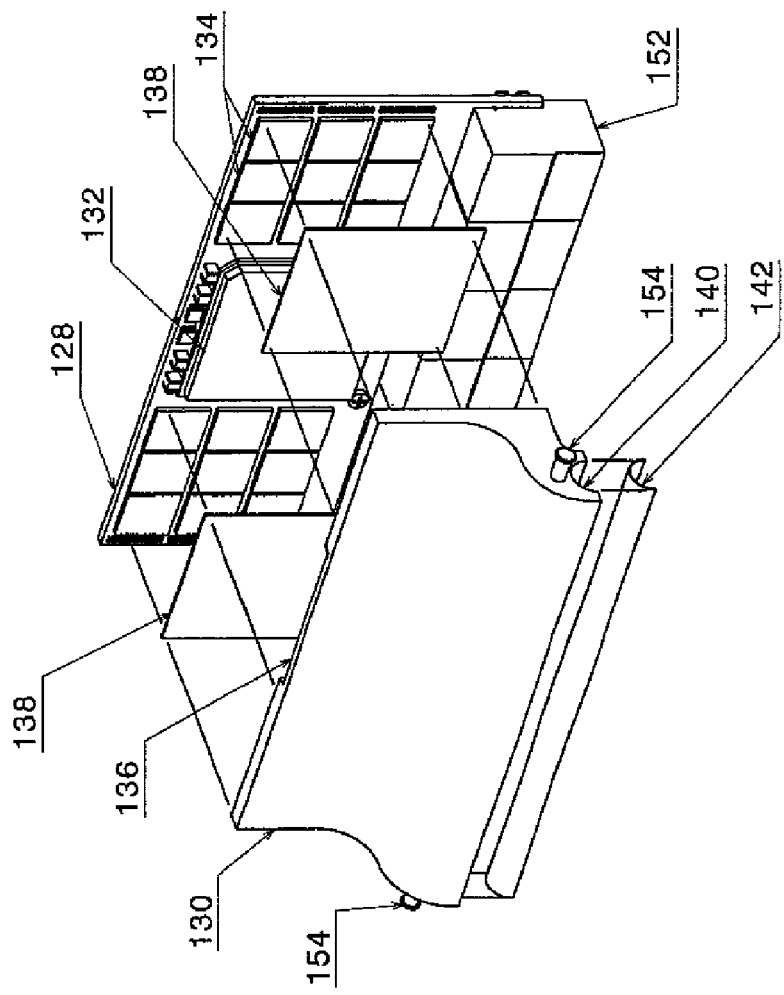
FIGS. 17A and 17B are perspective views illustrating a circuit card similar to a DIMM with a heat spreader that is used in another embodiment of this invention further illustrated in FIGS. 18 through 23.
Figure 17A:
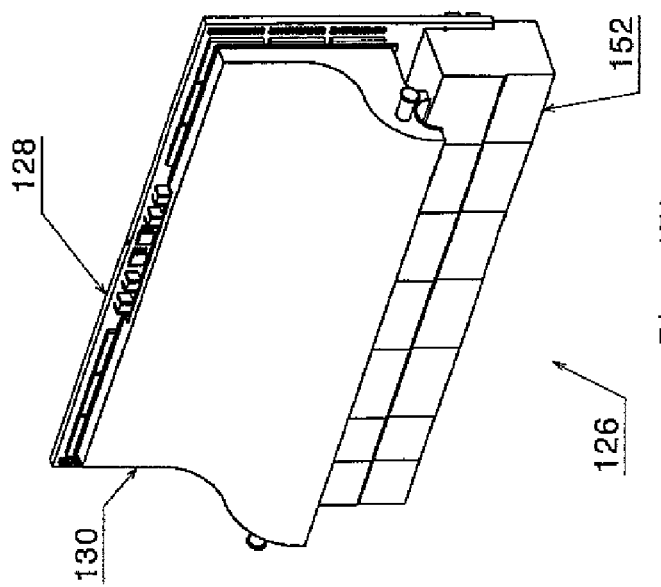

Referring to FIGS. 17A through 22, another embodiment of the invention includes a circuit card 128 having mounted on it a heat spreader 130. The circuit card 128 is similar to circuit cards 8, 102 whereas it has on it one or more chip packages 132 that are higher than other chip packages 134 that also need cooling, though it is not necessarily a DIMM, but instead could be any card that has one or a few chip heights and many chips whereby heat needs to be removed. In the circuit card 8 shown in FIG. 4B, a different heat spreader was used for each group of chip packages of a particular nominal height. A single heat spreader 130 is shown in FIGS. 17A and 17B for chip package groups of more than one height. The chip package 132 is higher than chip packages 134. A portion of heat spreader 130 has been removed to form depression 136. The depth of depression 136 is nominally equal to, or less than, the difference in height of chip 132 and 134. Typically, the power densities and cooling requirements are different for different chips. For example, chip 132 could be a CPU with a high power density and chips 134 could be DRAM with a much lower power density. The required thermal resistance to provide adequate cooling will depend on the power density and required chip junction temperature. When a common heat spreader is used for multiple chips on a card, it is desirable to only rigidly attach the heat spreader to one chip, preferably in the center, to minimize any potential stress during thermal cycling from TCE (thermal coefficient of expansion) mismatch between the substrate and the heat spreader Therefore, a compliant thermal interface material (TIM) is needed for the remaining chips. For example, for the case shown in FIG. 17B, if the heat spreader 130 is rigidly attached to the chip 132 using a thermally conductive adhesive material such as silver epoxy, or other filled polymer adhesives, the heat spreader 130 is compliantly attached to the remaining chips 134 using a thermal pad or gap fill material 138, for example, filled silicone rubber such as Sarcon®. Suitable materials are available up to 2 millimeters thick and can compress up to 90%. Depending on the thermal requirements, a depression 136 may not be required in the heat spreader 130. For very large heat spreaders 130 such as shown in FIGS. 17A and 17B, the heat spreader 130 is also attached to the circuit card 128 using fasteners (not shown). The purpose of this is to transfer forces to the circuit card 128 if the card assembly were to be dropped. Otherwise, the forces would overstress the solder connection of chip 132 to card 134. The heat spreader 130 also has a semicircular notch 140 to which a layer of gap fill material 142 is can be applied. The circuit card 128 with the assembled heat spreader 130 is illustrated in FIG. 17A as circuit card assembly 126. The assembly of circuit card assembly 126 is done in a controlled environment (as opposed to the field) so the application of the thermal interface materials (thermal adhesive and gap fill material) can be done under controlled conditions.

Figure 18:
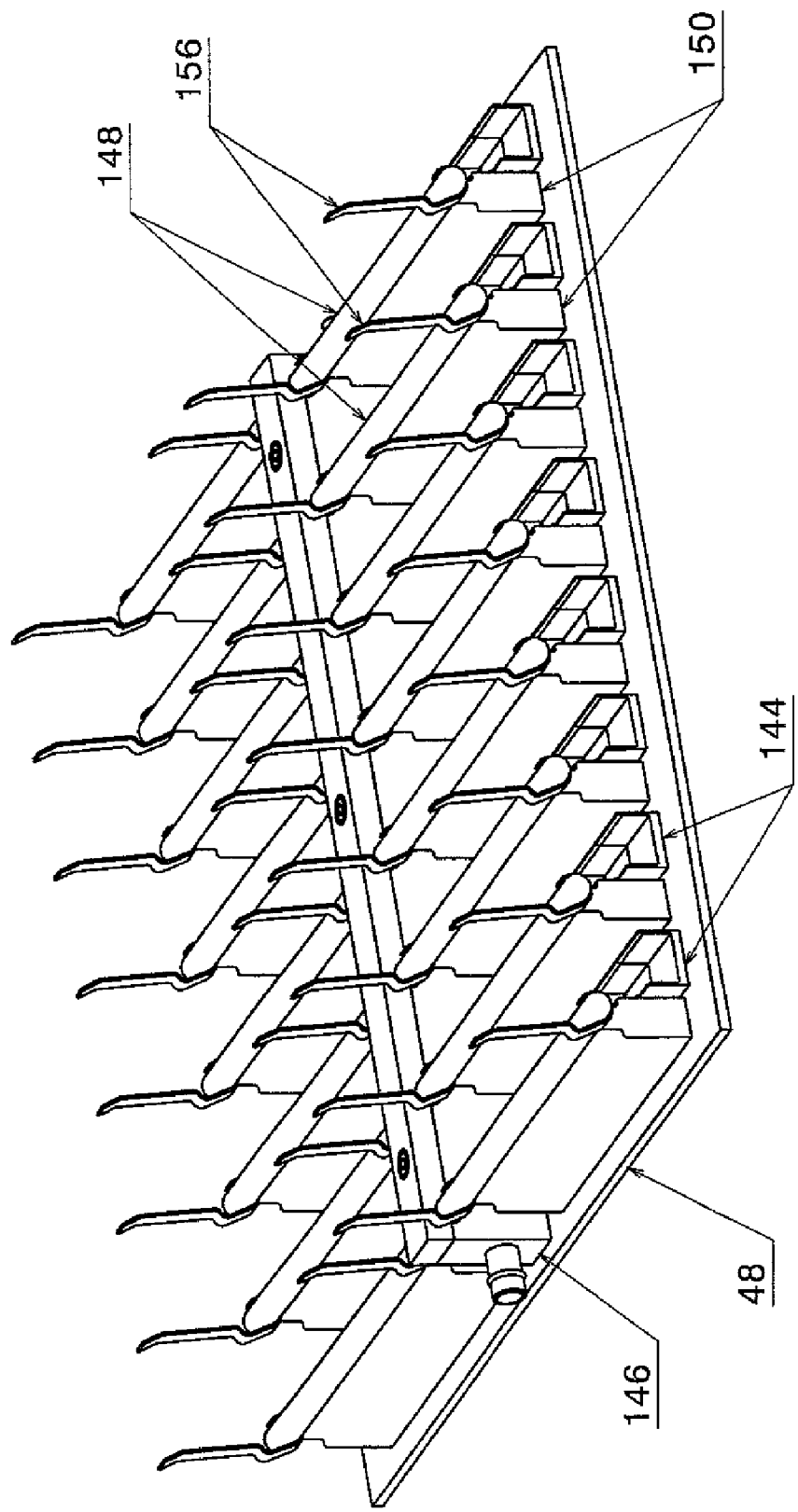

FIG. 18 illustrates a mother board 48 which contains connectors 144 and a water jacket 146. The water jacket 146 is similar to water jacket 32 shown in FIG. 6. The water jacket 146 contains the same locating features as water jacket 32 and a means of clamping heat pipes 148 in the same manner. The heat pipes 148 rest on support blocks 150 which are attached to mother board 48.

Figure 19:
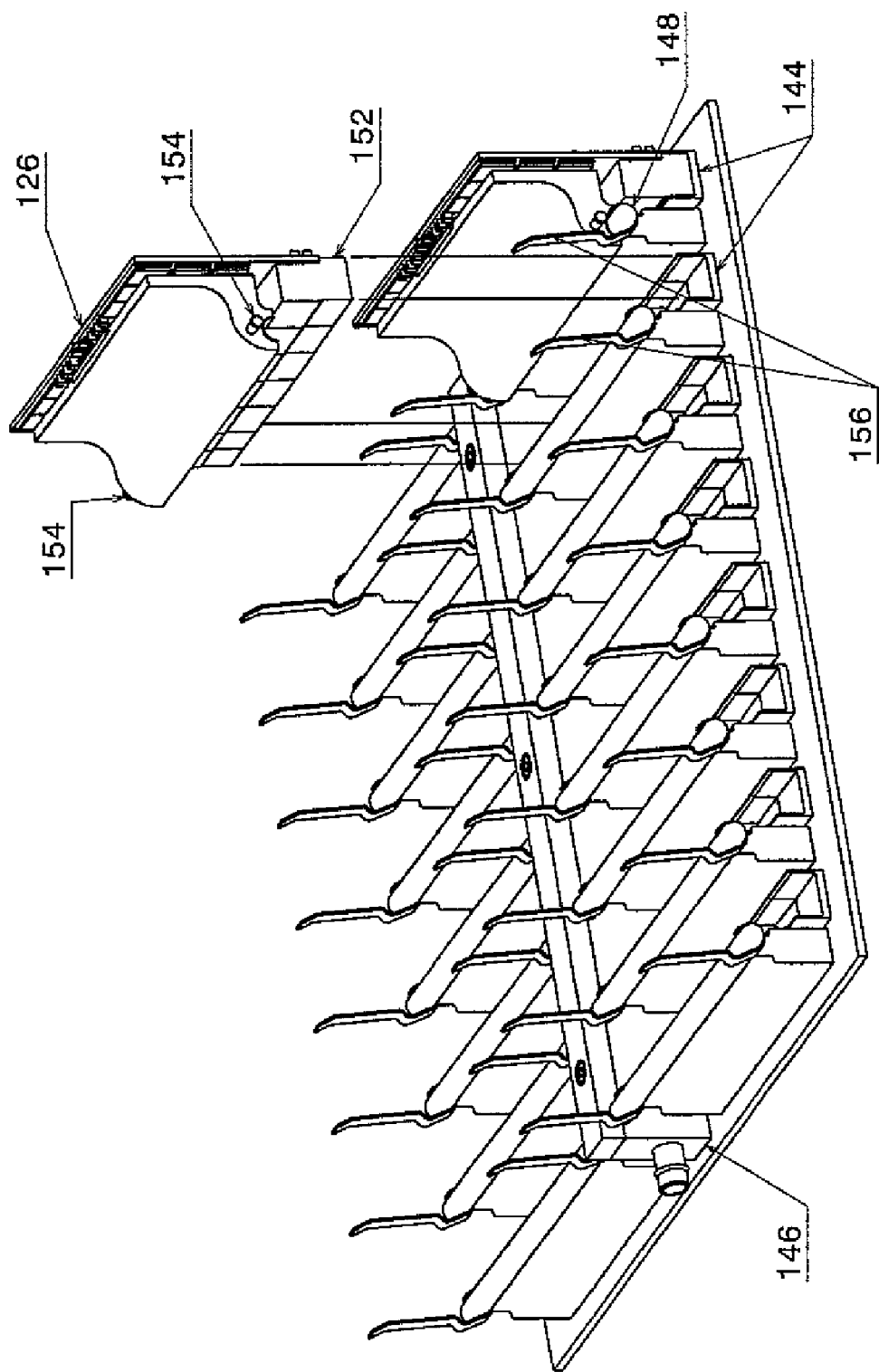
Figure 20C:
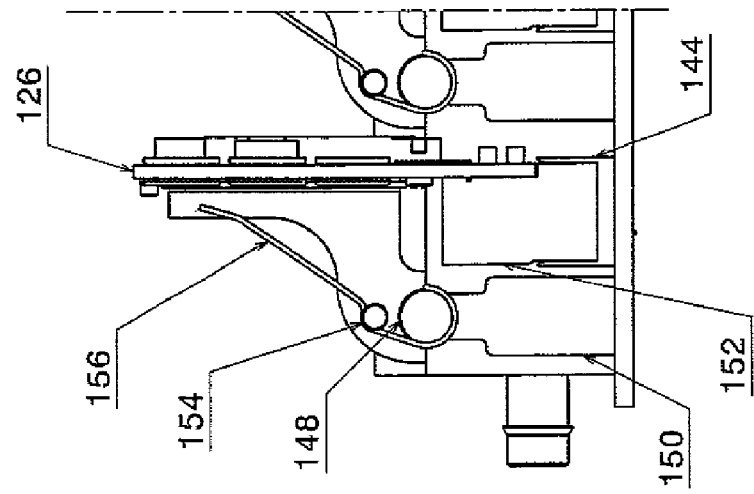
FIGS. 20A, 20B, and 20C are side elevational views showing details of the clamping mechanism of the daughter circuit card to the heat pipe.
Figure 20B:
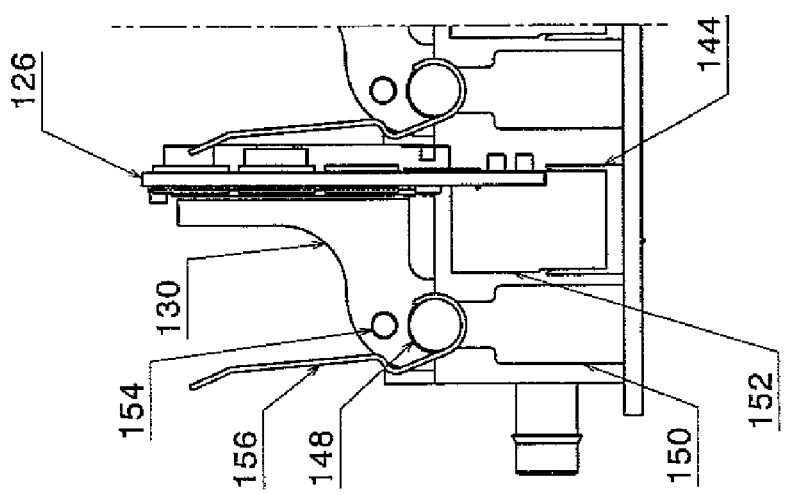
Figure 20A:
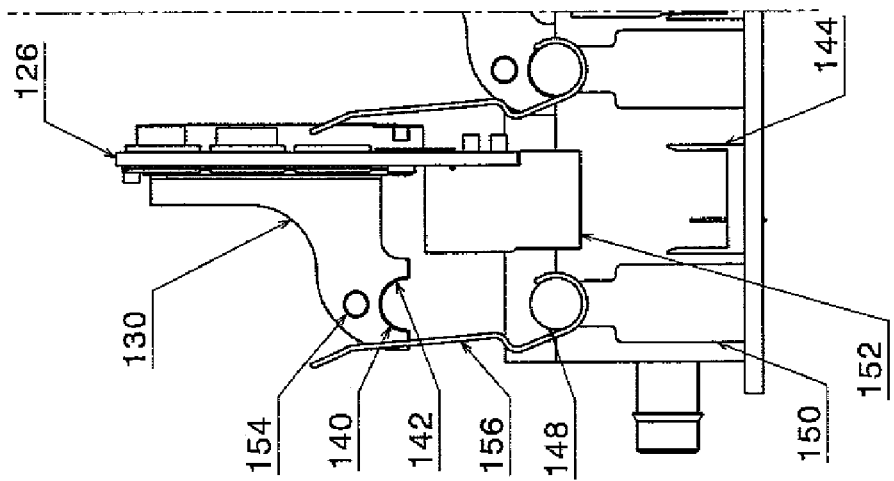

Referring to FIGS. 19, 20 the circuit card assembly 126 is applied to a mother board 48 (shown in FIG. 18). In these illustrations the connector used here consists of an array of electrical connections, for example, headers 152 and receptacles 144, which are suitable for high speed signals and a greater signal density than a simple DIMM connector can provide. Connectors 152 on circuit card assembly 126 connect with the mating half 144 on mother board 48. At the same time the semicircular notch 140 on heat spreader 130 aligns with heat pipe 148. Connectors 144 and 152 normally have about two millimeters of vertical motion after connection is made. Heat pipes 148 are mounted at a height such that the notch 140 bottoms out on the heat pipe 148 about 0.5 millimeter before connectors 144 and 152 bottom out. In this manner approximately plus or minus 0.5 millimeter height tolerance is taken up and allows the gap fill material or thermal pad material 142 to fully compress for maximum heat transfer capability, if such a material is used. In addition, any lateral tolerance is taken up by the gap fill material 142, or provided by tilting the card in the connector slightly in the direction perpendicular to the heat pipe 148. In the field, a defective circuit card 126 is replaced by another non-defective circuit card. When this occurs, after the defective card is removed and before the new card is inserted, heat pipe 148 needs to be cleaned of any residue of gap fill material 142 left from the defective card. This will allow the material 142 of the new card to make effective contact with heat pipe 148. To assure good contact is made between heat pipe 148 and heat spreader 130, a spring loaded locking mechanism is used, as illustrated in elevation views in FIGS. 20A, 20B, 20C, and FIGS. 21 and 22. The heat sink 130 has mounted on it two pins 154. When circuit card assembly 126 is plugged into the mother board 48, pins 154 align just above heat pipe 148. A locking spring 156 is made from spring-tempered steel and is shaped in such a manner that it clips onto heat pipe 148 and can move pivotally about it. After the circuit card assembly 126 is plugged in, the locking spring 156 is rotated to clip onto pin 154 as shown in FIG. 20C. The spring temper of locking spring 156 applies sufficient force to assure good contact between the heat spreader 130 and the heat pipe 148 after the gap fill material 142 has been compressed.

Figure 21:
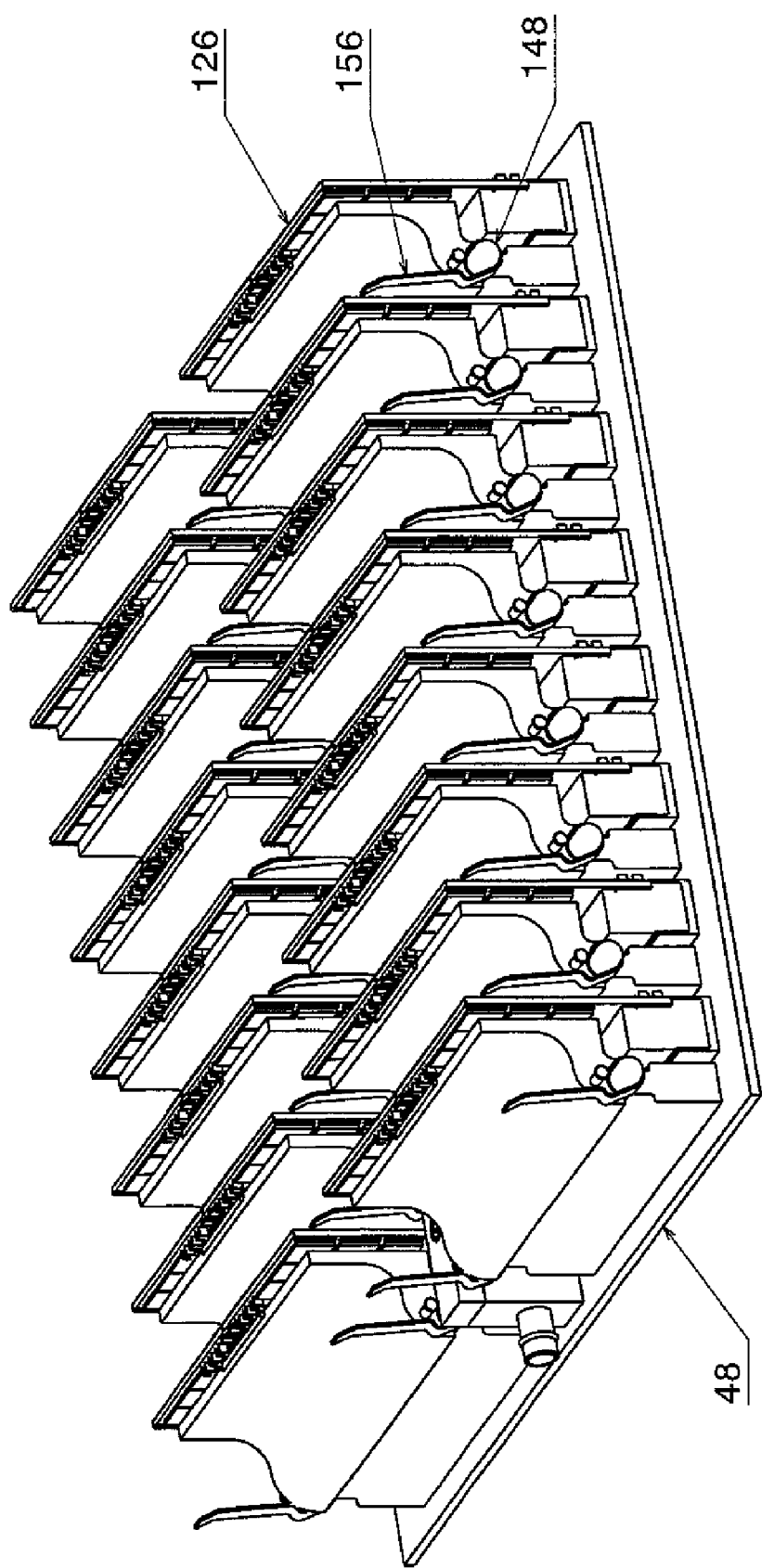
Figure 22:
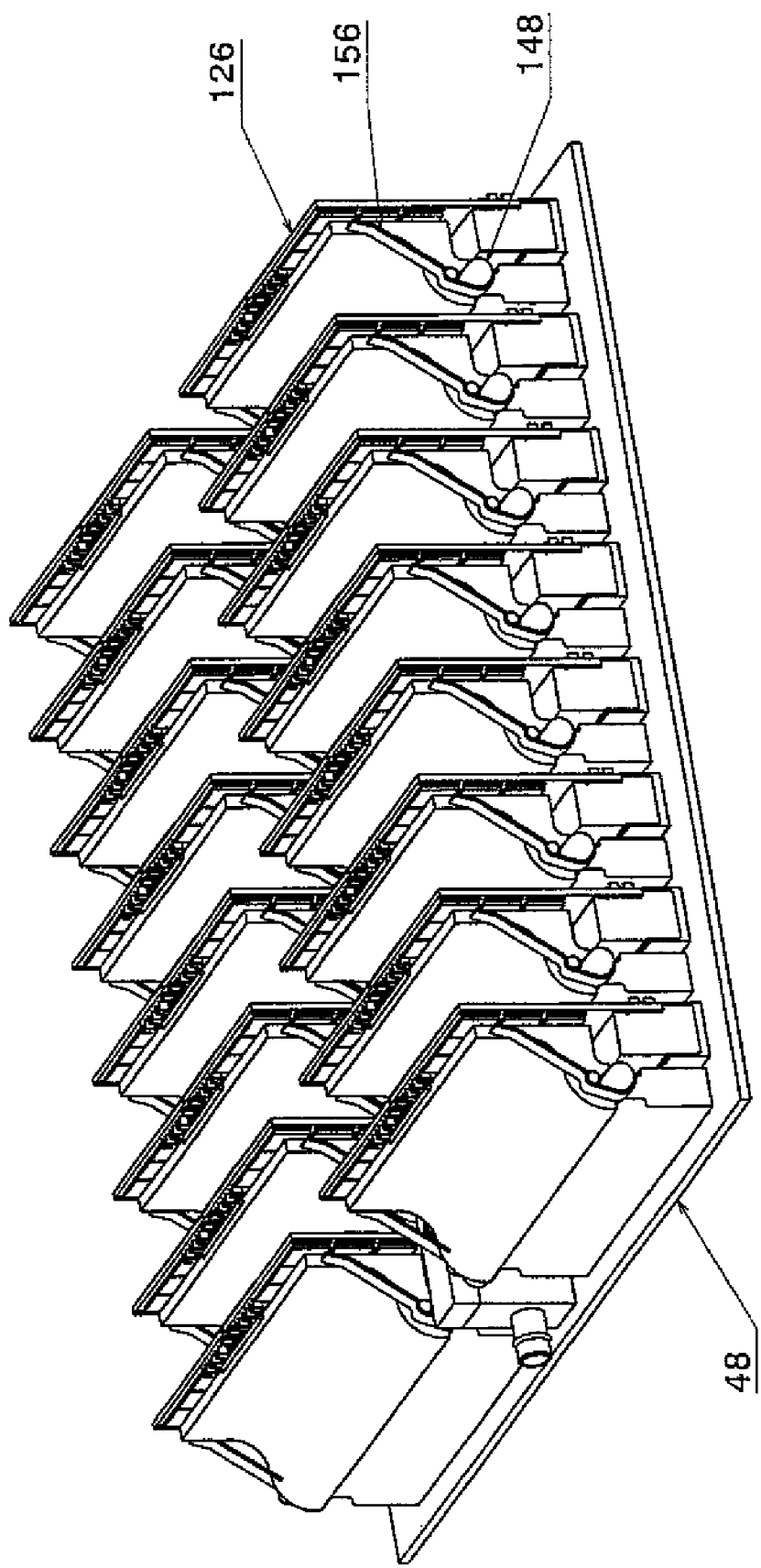

Referring to FIG. 21, an array of circuit card assemblies 126 are plugged into their respective connectors on mother card 48. The locking clips 156 are shown in their unlocked position. An array of circuit card assemblies 126 are shown in FIG. 22, with the locking clips shown in their locked position.

In a further embodiment, referring to FIG. 24, instead of using locking clips 156, a close mechanical interface such as was described with FIGS. 6 and 9 could be formed between the heat pipe 148 and the heat spreader 130 either by using fasteners, such as screws 149, to clamp together the heat spreader 130 and the support blocks 150, or a free floating pipe support structure 151 could be placed below heat pipe 148 and used for compressing heat pipe 148 against heat spreader 130. Note that, instead of the "pivot" type shown, screws on each side of the pipe could be used to secure the free floating pipe support structure 151.

Figure 23:
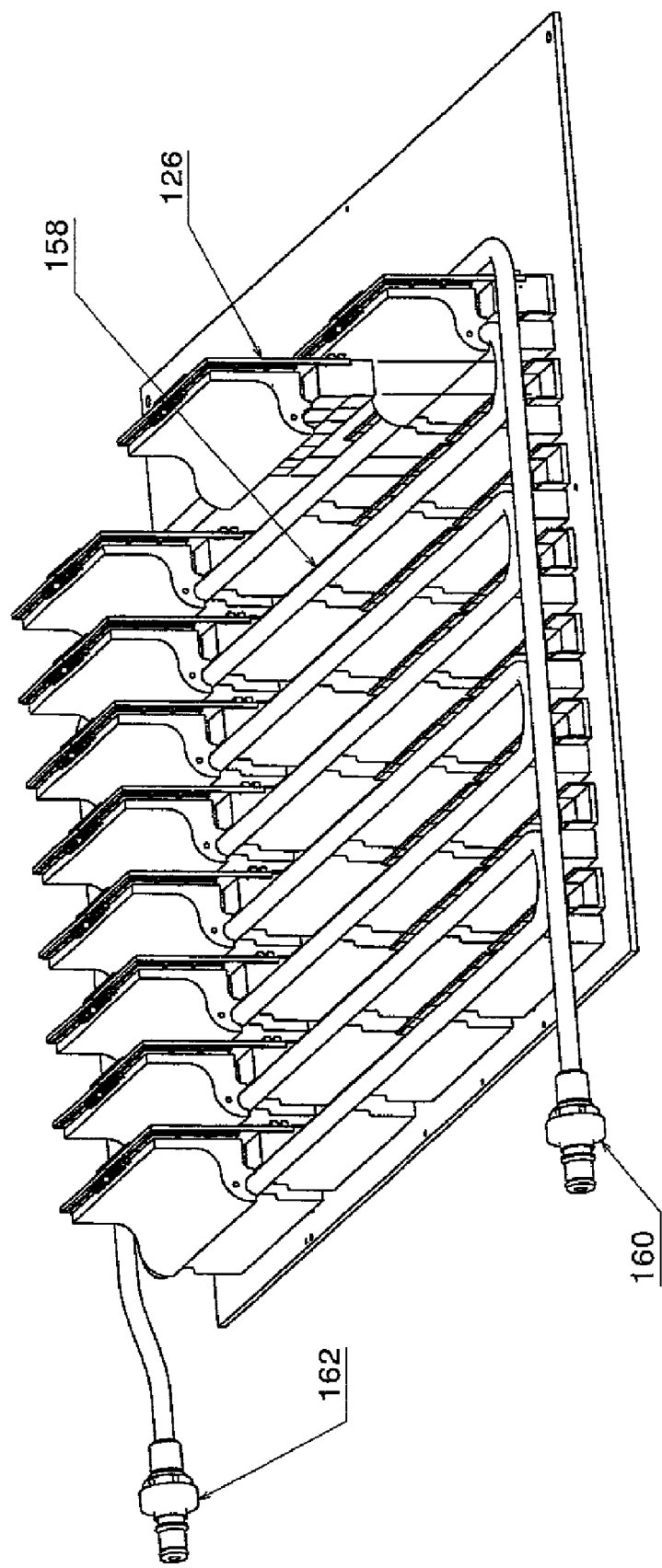
FIG. 23 is a perspective view illustrating another embodiment, using the heat spreaders shown in FIGS. 17A and 17B, but eliminating heat pipes and clamping a heat spreader directly to a water pipe.

Another embodiment of the invention is shown in FIG. 23 which is related to the previous embodiment, but instead of using water jacket 146 and heat pipes 148 a direct water pipe 158 is used. The water pipe 158 has a water input connector 160 and a water output connector 162 whereby cooling water is pumped through water pipe 158. The direct water pipe 158 replaces the water jacket 146 and heat pipes 148 and connects to circuit card assembly 126 in a similar manner, either using a gap fill, or other thermal interface material along with a locking mechanism, or by means of a dry, or oil filled close mechanical interface using fasteners to clamp together the heat spreader and the water pipe. Note that if a dry, or oil filled thermal interface is used, due to the mechanical tolerances of the components, it may be desirable to have the radius of curvature of the semicircular notch 140 be between 0.1 and 0.5 mm larger than the radius of the water pipe 158. The heat pipes described previously have relatively thin walls, which can be distorted to form tight mechanical fits against the water jacket assembly 32 where the water pipe 158 has a thicker wall which is more difficult to distort.

Thus, a cooling apparatus, and system and method for cooling an electronic device according to the present invention is provided in the embodiments of the invention described herein. The cooling apparatus of the present invention comprises at least one heat producing electronic device such as the DIMM 8 and DRAM 6 circuit card shown in FIG. 2. A heat transfer device such as the heat spreaders 12, 14 in FIG. 3A are connected to the heat producing electronic device and thermally communicating with the heat producing device for transferring heat from the heat producing device to the heat transfer device. A heat conduit such as the heat pipe 16 shown in FIG. 3B or the water pipe 158 shown in FIG. 23 is connected to the heat transfer device and the heat conduit thermally communicates with the heat transfer device for transferring heat to the heat conduit from the heat transfer device. A cooling housing embodied as the water jacket is connected to the heat conduit. The cooling housing defines at least one passageway for circulating thermally conductive fluid, which may be a liquid such as water, and the cooling housing thermally communicates with the heat conduit for transferring heat to the fluid of the cooling housing from the heat conduit.

While the present invention has been particularly shown and described with respect to preferred embodiments thereof it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A cooling apparatus for an electronic device, comprising:
a plurality of heat producing electronic devices affixed to a wiring substrate;
a heat transfer device connected to the heat producing electronic devices and thermally communicating with the heat producing electronic devices for transferring heat from the heat producing electronic devices to the heat transfer device, the heat transfer device including metal, the heat transfer device being in overlapping relation to the plurality of heat producing electronic devices;
a heat conduit mechanically and thermally connected to the heat transfer device, the heat conduit thermally communicating with the heat transfer device for transferring heat to the heat conduit from the heat transfer device, the heat conduit including metal and being releasably mechanically connected to the heat transfer device;
a plurality of cooling housings mechanically and thermally connected to the heat conduit, the cooling housings being positioned at opposite longitudinal ends of the heat producing electronic devices and the plurality of cooling housings traversing a plane defined by the heat producing electronic devices, the plurality of cooling housings being releasably mechanically connected to the heat conduit, wherein the plurality of cooling housings transport thermally conductive fluid therethrough for transferring heat from the heat transfer device and the heat conduit to the fluid, and the cooling housings support and position the heat conduit, the plurality of cooling housings being positioned adjacent the heat transfer device and the plurality of heat producing electronic devices, and the plurality of cooling housings not being in overlapping relation with the plurality of heat producing electronic devices and the heat transfer device, the cooling housings being self contained such that the fluid is contained in the plurality of cooling housings and not in contact with the heat transfer device and the heat conduit; and
a plurality of mounting devices being part of each of the plurality of cooling housings for releasably coupling the heat conduit.

2. The apparatus of claim 1, wherein the heat conduit is a closed loop and includes a fluid therein for thermally conducting heat from the heat transfer device to the fluid, and the cooling housings define at least one passageway for circulating fluid in a closed loop, and conductively transferring heat from the heat conduit fluid to the cooling housings' thermally conductive fluid.

3. The apparatus of claim 2, wherein the heat conduit fluid is a liquid which condenses after evaporating when the heat conduit fluid temperature decreases after heat from the heat conduit fluid is transferred to the cooling housing fluid.

4. The apparatus of claim 2, further including:
a plurality of clamping devices being part of each of the mounting devices for releasably holding the heat conduit in contact with the cooling housings.

5. The apparatus of claim 4, further including:
a plurality of locking mechanisms being part of each of the clamping devices for releasably locking the heat conduit into a specified location on the cooling housings.

6. The apparatus of claim 2, wherein the heat conduit is substantially cylindrically shaped.

7. The apparatus of claim 2, wherein the heat conduit includes a planar surface area.

8. The apparatus of claim 1, wherein the heat producing electronic devices include memory modules having a plurality of memory chips attached thereon.

9. The apparatus of claim 1, further including:
a thermal interface element between the heat producing electronic devices and the heat transfer device.

10. The apparatus of claim 1, further including:
a thermal interface element between the heat transfer device and the heat conduit.

11. The apparatus of claim 1, wherein the heat transfer device comprises a plurality of heat transfer devices that each mate with and thermally communicate with different portions of the heat producing electronic devices, and the different portions of the heat producing devices have differing dimensions.

12. The apparatus of claim 1, wherein the heat transfer device is connected to a front portion of the heat producing electronic devices.

13. The apparatus of claim 1, further including a plurality of the heat transfer device which are each attached to front and back areas of the heat producing electronic devices.

14. The apparatus of claim 1, further including:
a printed circuit board (PCB) having the heat producing electronic devices attached thereto and the housing being attached to the PCB.

15. The apparatus of claim 14, wherein the cooling housings extends along the PCB with the heat producing electronic devices on both sides thermally communicate with the cooling housings.

16. The apparatus of claim 1, wherein the heat transfer device includes a semicircular notch on a surface perpendicular a planar surface area, and the planar surface area contacts the heat producing electronic devices.

17. The apparatus of claim 1, wherein the heat conduit is a cylindrical heat pipe having a length and defining a longitudinal axis and the cooling housings extend in a direction traversing the longitudinal axis of the heat conduit.

18. The apparatus of claim 1, further comprising:
a printed circuit board (PCB) having the heat producing electronic devices attached thereto;
a plurality of clamping devices being part of each of the mounting devices for releasably holding the heat conduit in contact with the cooling housings; and
a plurality of locking mechanisms being part of each of the clamping devices for releasably locking the heat conduit into a specified location on the cooling housings, and the heat conduit contacting the cooling housings when the heat producing electronic devices are plugged into the PCB.

19. A cooling system for an electronic device, comprising:
a plurality of heat producing electronic devices affixed to a substrate;
heat transfer devices connected to the heat producing electronic devices and thermally communicating with the heat producing devices for transferring heat from the heat producing devices to the heat transfer devices, the heat transfer devices including metal, the heat transfer devices being in overlapping relation to the plurality of heat producing electronic devices;
a heat conduit mechanically and thermally connected to the heat transfer devices, the heat conduit thermally communicating with the heat transfer devices for transferring heat to the heat conduit from the heat transfer device, and the heat transfer devices each mate with and thermally communicate with different portions of the heat producing electronic devices, and some of the different portions of the heat producing devices have differing dimensions, the heat conduit including metal and being releasably mechanically connected to the heat transfer devices; and a plurality of cooling housings mechanically and thermally connected to the heat conduit using clamping devices for releasably holding the heat conduit in contact with the cooling housings, the plurality of cooling housings define at least one passageway for circulating thermally conductive fluid, and the cooling housings thermally communicating with the heat conduit for transferring heat to the fluid of the cooling housings from the heat conduit, the plurality of cooling housings being releasably mechanically connected to the heat conduit, wherein the plurality of cooling housings transport the thermally conductive fluid therethrough for transferring heat from the heat transfer device and the heat conduit to the fluid, and the cooling housings support and position the heat conduit, the plurality of cooling housings being positioned adjacent the heat transfer device and the plurality of heat producing electronic devices, and the plurality of cooling housings not being in overlapping relation with the plurality of heat producing electronic devices and the heat transfer device, the cooling housings being self contained such that the fluid is contained in the plurality of cooling housings and not in contact with the heat transfer device and the heat conduit.

20. The apparatus of claim 19, wherein the heat producing electronic devices each include a plurality of computer memory chips.

21. A method of cooling an electronic device, comprising:
providing at least one heat producing electronic device;
transferring heat from the heat producing electronic device to a heat transfer device, the heat transfer device being connected to and thermally communicating with the heat producing device;
transferring heat to a heat conduit from the heat transfer device, the heat conduit being connected to and thermally communicating with the heat transfer device;
transferring heat from the heat conduit to a thermally conductive fluid of a plurality of cooling housings, the cooling housings being connected to and thermally communicating with the heat conduit;
positioning the cooling housings at opposite longitudinal ends of the heat producing electronic device and the heat conduit and traversing a plane defined by the heat producing electronic device, the plurality of cooling housings being releasably mechanically connected to the heat conduit, wherein the plurality of cooling housings transport the thermally conductive fluid therethrough for transferring heat from the heat transfer device and the heat conduit to the fluid, and the cooling housings support and position the heat conduit;
releasably coupling the heat conduit to the cooling housings using a plurality of mounting devices being part of each of the plurality of cooling housings; and
positioning the of cooling housings adjacent the heat transfer device and the plurality of heat producing electronic devices, and the plurality of cooling housings not being in overlapping relation with the plurality of heat producing electronic devices and the heat transfer device, the cooling housings being self contained such that the fluid is contained in the plurality of cooling housings and not in contact with the heat transfer device and the heat conduit.

22. The method of claim 21, further comprising:
connecting the heat conduit to the cooling housings when the heat producing electronic devices are plugged into a printed circuit board;
releasably holding the heat conduit in contact with the cooling housings using a plurality of clamping devices being part of each of the mounting devices; and
releasably locking the heat conduit into a specified location on the cooling housings using a plurality of locking mechanisms being part of each of a plurality of clamping devices of the mounting devices.

* * * * *